United States Patent
Smith et al.

(10) Patent No.: US 12,400,956 B2
(45) Date of Patent: *Aug. 26, 2025

(54) REDUCED PITCH MEMORY SUBSYSTEM FOR MEMORY DEVICE

(71) Applicant: Micron Technology, Inc., Boise, ID (US)

(72) Inventors: Michael A. Smith, Boise, ID (US); Haitao Liu, Boise, ID (US); Vladimir Mikhalev, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/610,267

(22) Filed: Mar. 20, 2024

(65) Prior Publication Data

US 2024/0234311 A1    Jul. 11, 2024

Related U.S. Application Data

(60) Continuation of application No. 18/083,445, filed on Dec. 16, 2022, now Pat. No. 11,973,031, which is a
(Continued)

(51) Int. Cl.
*H01L 23/528*     (2006.01)
*H10B 10/00*      (2023.01)
(Continued)

(52) U.S. Cl.
CPC .......... *H01L 23/528* (2013.01); *H10B 10/12* (2023.02); *H10D 30/025* (2025.01); *H10D 30/60* (2025.01);
(Continued)

(58) Field of Classification Search
CPC .............. H01L 29/78; H01L 29/7827; H01L 29/66666; H01L 29/4232; H01L 27/092;
(Continued)

(56) References Cited

U.S. PATENT DOCUMENTS 5,239,196 A  *  8/1993  Ikeda ................. H10B 10/12
                                                      257/385
6,229,186 B1     5/2001  Ishida
(Continued)

OTHER PUBLICATIONS

International Application No. PCT/US2021/043093—International Search Report and Written Opinion, dated Nov. 18, 2021, 8 pages.

*Primary Examiner* — Michael M Trinh
(74) *Attorney, Agent, or Firm* — Dorsey & Whitney LLP

(57) ABSTRACT

A memory device includes an array of memory cells and a plurality of bit-lines with each bit-line connected to a respective set of memory cells of the array of memory cells. The memory device includes a memory subsystem having first and second memory circuits. Each first memory circuit can be disposed laterally adjacent to a second memory circuit. Each first memory circuit includes a first bit-line connection and each second memory circuit including a second bit-line connection, the first and second bit-line connections can connect to respective bit-lines. Each first bit-line connection is disposed on a first bit-line connection line of the memory subsystem and each second bit-line connection is disposed on a second bit-line connection line of the memory subsystem, and the second bit-line connection line can be offset from the first bit-line connection line by a predetermined distance that is greater than zero.

20 Claims, 13 Drawing Sheets

Related U.S. Application Data division of application No. 16/986,776, filed on Aug. 6, 2020, now Pat. No. 11,557,537.

(51) Int. Cl.
*H10D 30/01* (2025.01)
*H10D 30/60* (2025.01)
*H10D 30/63* (2025.01)
*H10D 84/01* (2025.01)
*H10D 84/03* (2025.01)
*H10D 84/85* (2025.01)

(52) U.S. Cl.
CPC ......... *H10D 30/63* (2025.01); *H10D 84/0195* (2025.01); *H10D 84/038* (2025.01); *H10D 84/85* (2025.01)

(58) Field of Classification Search
CPC ........... H01L 27/1104; H01L 29/42372; H01L 29/4238; H01L 29/42376; H01L 21/823885; H01L 21/823828; H01L 23/528; H10B 10/12; H10D 30/025; H10D 30/60; H10D 30/63; H10D 84/0195; H10D 84/038; H10D 84/01; H10D 84/85; H10D 84/8311; H10D 84/8312; H10D 84/83135; H10D 84/83138; H10D 84/8314; H10D 84/8316; H10D 84/851; H10D 84/852
See application file for complete search history.

(56) References Cited

U.S. PATENT DOCUMENTS

| | | | |
|---|---|---|---|
| 8,692,317 B2 | 4/2014 | Takeuchi | |
| 8,766,365 B2 * | 7/2014 | Smith | H01L 27/0266 257/500 |
| 9,251,888 B1 | 2/2016 | Liaw | |
| 10,163,893 B1 | 12/2018 | Smith | |
| 10,679,982 B2 * | 6/2020 | Smith | G11C 16/16 |
| 10,741,582 B2 * | 8/2020 | Herner | H01L 29/0847 |
| 11,152,383 B2 * | 10/2021 | Chen | H10B 41/35 |
| 11,557,537 B2 | 1/2023 | Smith et al. | |
| 11,973,031 B2 * | 4/2024 | Smith | H01L 29/7827 |
| 2010/0219483 A1 * | 9/2010 | Masuoka | H01L 27/1203 257/369 |
| 2011/0075470 A1 * | 3/2011 | Liaw | H10B 10/00 365/189.05 |
| 2015/0236033 A1 | 8/2015 | Watanabe | |
| 2016/0071842 A1 | 3/2016 | Smith et al. | |
| 2018/0069016 A1 | 3/2018 | Barbato | |
| 2018/0122793 A1 | 5/2018 | Moroz et al. | |
| 2018/0175052 A1 | 6/2018 | Sim et al. | |
| 2018/0308853 A1 | 10/2018 | Bell et al. | |
| 2019/0067271 A1 | 2/2019 | Smith | |
| 2019/0096894 A1 * | 3/2019 | Bell | H01L 21/76202 |
| 2022/0044994 A1 | 2/2022 | Smith et al. | |
| 2023/0123487 A1 | 4/2023 | Smith et al. | |

* cited by examiner

REDUCED PITCH MEMORY SUBSYSTEM FOR MEMORY DEVICE

CROSS-REFERENCE TO RELATED APPLICATIONS

This application is a continuation of U.S. patent application Ser. No. 18/083,445, filed Dec. 16, 2022, now U.S. Pat. No. 11,973,031; which is a division of U.S. patent application Ser. No. 16/986,776, filed Aug. 6, 2020, now U.S. Pat. No. 11,557,537; each of which is incorporated herein by reference in its entirety.

TECHNICAL FIELD

The present disclosure relates generally to memory devices, and, in particular, the present disclosure relates to reduced pitch memory subsystems for memory devices.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), static random access memory (SRAM), and flash memory. As memory devices advance, it is desirable to make memory devices, including memory subsystems, as small and/or as dense as possible.

For the reasons stated above, and for other reasons stated below which will become apparent to those skilled in the art upon reading and understanding the present specification, there is a need in the art for memory subsystems that allow for smaller pitches.

DETAILED DESCRIPTION

Figure 1:
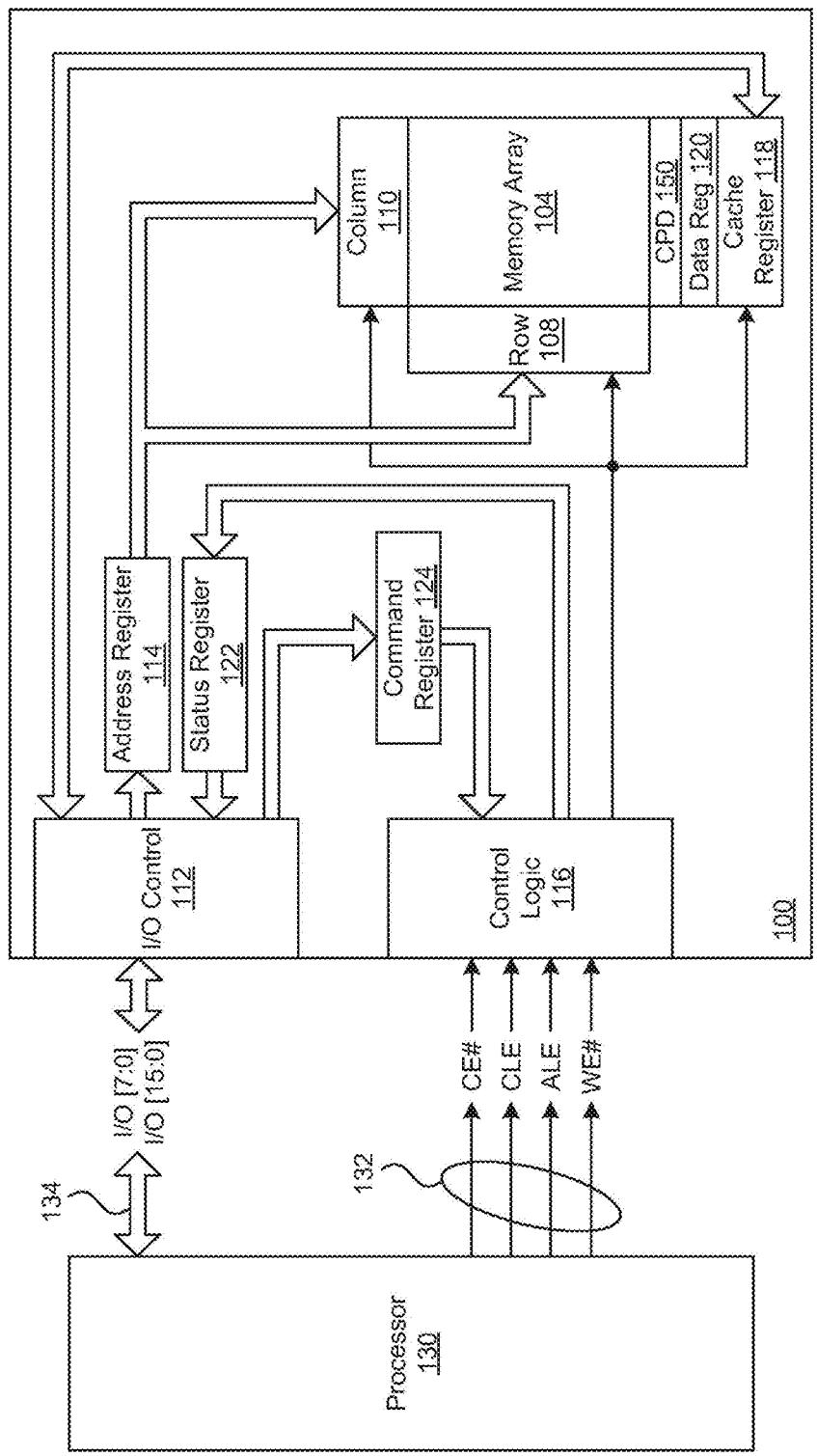
FIG. 1 illustrates a block diagram of an embodiment of a memory system in accordance with the present disclosure.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

Some exemplary embodiments of the present disclosure can be directed to a memory device such as, for example, a flash memory device. Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the memory cells, through programming (which is sometimes referred to as writing) of charge-storage structures (e.g., floating gates or charge traps) or other physical phenomena (e.g., phase change or polarization), determine the data value of each memory cell. Common uses for flash memory and other non-volatile memory may include personal computers, personal digital assistants (PDAs), digital cameras, digital media players, digital recorders, games, appliances, vehicles, wireless devices, mobile telephones, and removable memory modules, and the uses for non-volatile memory continue to expand.

In a NOR flash architecture, memory cells, arranged in a column, are coupled in parallel, with each memory cell coupled to a data line, such as a bit line. A "column" refers to a group of memory cells that are commonly coupled to a local data line, such as a local bit line. It does not require any particular orientation or linear relationship, but instead refers to the logical relationship between memory cell and data line. Typically, the array of memory cells for NAND flash memory devices is arranged such that the control gate of each memory cell of a row of the array is connected together to form an access line, such as a word line. Columns of the array include strings (often termed NAND strings) of memory cells connected together in series, e.g., source to drain, between a pair of select lines, e.g., a source select line and a drain select line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

The present disclosure is directed to a memory device having an array of memory cells. The memory device includes a plurality of bit-lines with each bit-line connected to a respective set of memory cells of the array of memory cells. The memory device can include a memory subsystem having a set of first memory circuits and a set of second memory circuits. Each first memory circuit can be disposed laterally adjacent to a second memory circuit. Each first memory circuit includes a first bit-line connection and each second memory circuit including a second bit-line connection, the first and second bit-line connections can be adapted to connect to respective bit-lines of the plurality of bit-lines. In some embodiments, each of the first bit-line connections is disposed on a first bit-line connection line of the memory subsystem and each of the second bit-line connections is disposed on a second bit-line connection line of the memory subsystem, and the second bit-line connection line can be offset from the first bit-line connection line by a predetermined distance that is greater than zero.

In another embodiment a memory device includes an array of memory cells and a plurality of bit-lines with each bit-line connected to a respective set of memory cells of the array of memory cells. The memory device includes a memory circuit having a memory latch. The memory latch includes a first integrated inverter having at least one vertical transistor and a second integrated inverter having at least one vertical transistor. In some embodiments, each integrated inverter includes a common input gate that has a gate-all-around configuration.

FIG. 1 is a simplified block diagram of a NAND flash memory device 100 in communication with a processor 130 as part of an electronic system, according to an embodiment. The processor 130 may be a memory controller or other external host device. Memory device 100 includes an array of memory cells 104. A row decoder 108 and a column decoder 110 are provided to decode address signals. Address signals are received and decoded to access memory array 104.

Memory device 100 also includes input/output (I/O) control circuitry 112 to manage input of commands, addresses, and data to the memory device 100 as well as output of data and status information from the memory device 100. An address register 114 is in communication with I/O control circuitry 112, and row decoder 108 and column decoder 110, to latch the address signals prior to decoding. A command register 124 is in communication with I/O control circuitry 112 and control logic 116 to latch incoming commands. Control logic 116 controls access to the memory array 104 in response to the commands and generates status information for the external processor 130. The control logic 116 is in communication with row decoder 108 and column decoder 110 to control the row decoder 108 and column decoder 110 in response to the addresses.

Control logic 116 is also in communication with memory subsystem circuits that can include a cache register 118, a data register 120, and/or a circuit-protection subsystem 150. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

A circuit-protection subsystem 150, according to various embodiments, can be arranged between data register 120 (and/or cache register 118) and memory array 104. For example, low-voltage circuitry of data register 120 and/or cache register 118 may be coupled to one side (e.g., a low-voltage side) of the circuit-protection subsystem 150 and data lines or bit-lines of memory array 104 may be coupled to another side (e.g., a high-voltage side) of the circuit-protection subsystem 150.

Memory device 100 receives control signals at control logic 116 from processor 130 over a control link 132. The control signals may include at least a chip enable CE #, a command latch enable CLE, an address latch enable ALE, and a write enable WE #. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O at control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments. The configuration of memory array 104 is known to those skilled in the art and thus will not be further discussed except as needed to describe the exemplary embodiments of the present disclosure. In addition, although the exemplary embodiments may be discussed in conjunction with a NAND flash architecture, the embodiments described herein are not limited to NAND flash, and exemplary embodiments can include other flash architectures, such as NOR flash, etc.

Data lines are sometimes coupled to circuitry that may be configured to handle relatively low voltages (e.g., that may be referred to as low-voltage circuitry), such as data cache circuitry. The low-voltage circuitry may provide relatively low voltages (e.g., 0 V up to about 4 V) to the data lines during read or write operations. However, during erase operations (e.g., involving NAND memory arrays), memory cells may be erased a block at a time by grounding all of the access lines in the block, for example, while allowing the data lines to float. A relatively high erase voltage (e.g., about 20 V to 30 V) is then applied to a semiconductor on which the memory cells are formed, and thus to the channels of the memory cells, to remove the charge from the charge-storage structures. This can cause the data lines to float to about the erase voltage and can damage the low-voltage circuitry coupled to data lines.

Protection devices, such as field-effect transistors (FETs), may be coupled between the bit lines and low-voltage circuitry, such as, for example, the low-voltage circuitry of data cache 118 and/or the low-voltage circuitry of data register 120, to protect the low-voltage circuitry from the relatively high voltages that may be present on the bit lines during an erase operation. For example, an FET may be turned off during an erase operation to protect the low-voltage circuitry from the relatively high voltages that may be present on the bit lines, and the FET may be turned on during a read or write operation to pass the relatively low voltages between the low-voltage circuitry and the bit lines. Each circuit-protection device may be formed on an active region that is separated and electrically isolated from an adjacent active region, on which an adjacent circuit-protection device is formed, by an isolation region, such as a shallow-trench isolation (STI) region. A bit line may be coupled to a high-voltage side of a circuit-protection device, and the low-voltage circuitry may be coupled to a low-voltage side of a circuit-protection device. For example, for an FET, a contact (e.g., that may be referred to as a high-voltage-side contact) can couple a bit line to a source/drain region on the high-voltage side, and a contact (e.g., also referred to as a low-voltage-side contact) may couple low-voltage circuitry to a source/drain region on the low-voltage side. The circuit-protection devices may be coupled on a one-to-one basis to the bit lines or one circuit-protection device to two or more data lines through a multiplexer. However, the pitch of the circuit-protection devices may be relatively large (e.g., 38 nm or greater) in order to avoid breakdown of the circuit-protection devices. The relatively large pitch uses up considerable area and thus may increase the size of the memory device.

Figure 2A:
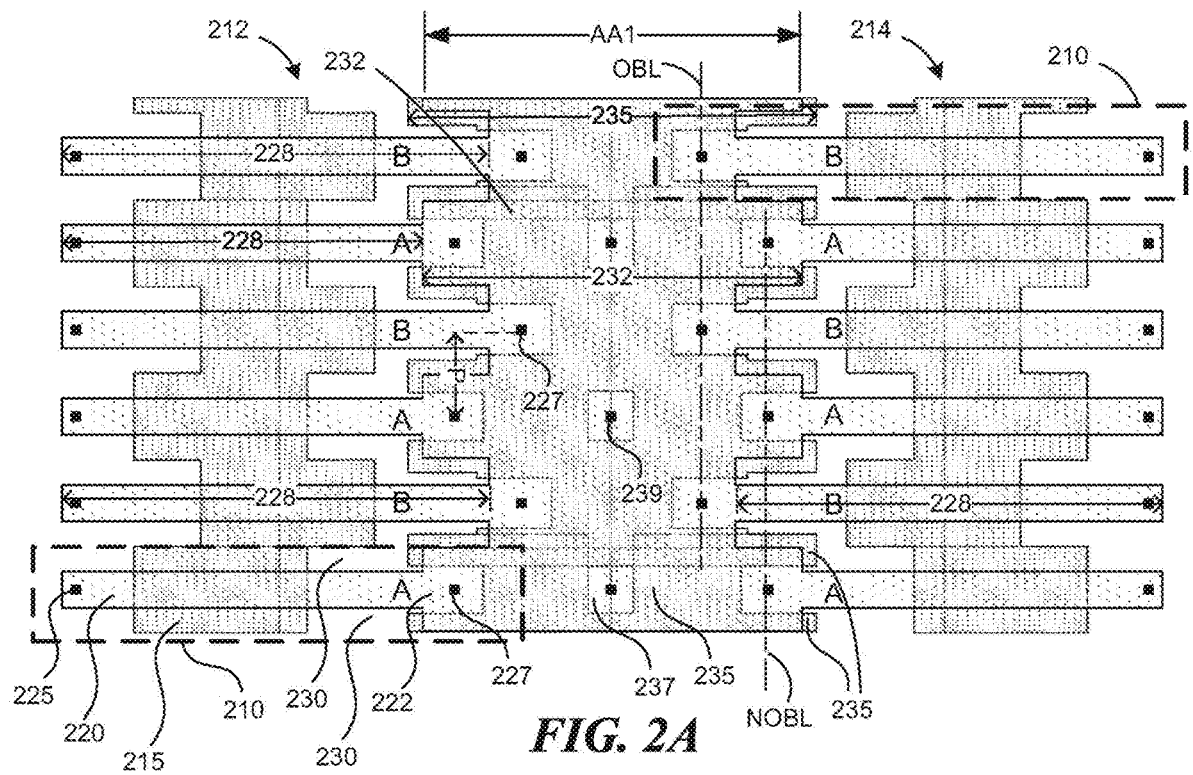
FIGS. 2A and 2B illustrate top plan views of simplified layout diagrams of protection circuits in accordance with the present disclosure.
Figure 2B:
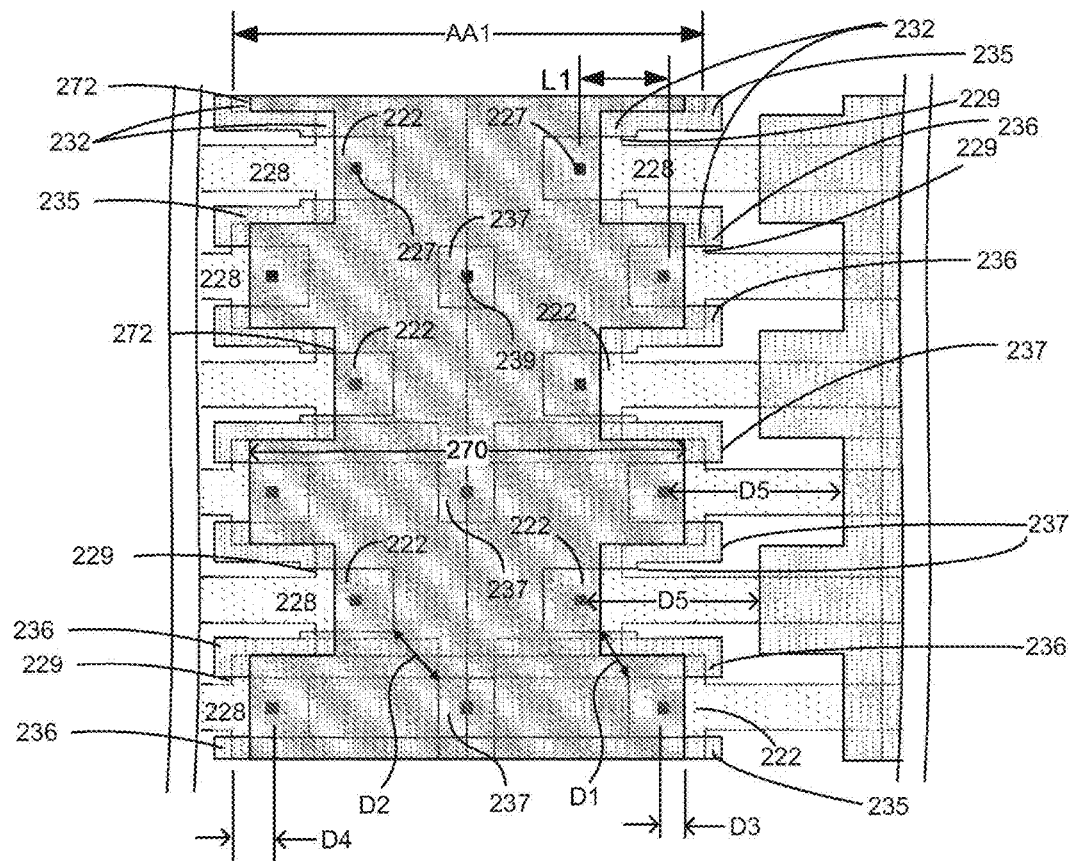

FIGS. 2A and 2B are top plan views of an exemplary embodiment of a portion of circuit-protection subsystem 150 that can include a plurality of protection circuits 210 to provide high-voltage isolation (e.g., isolating a 20V to 30V signal). Similar protection circuits are discussed in detail in Applicant's U.S. Pat. Nos. 8,766,365 and 10,163,893, which are incorporated herein by reference in their entirety as background. Accordingly, for brevity, description of the protection circuits herein focuses on the features of the present inventive technology. In addition, although exemplary embodiments of the present disclosure are provided using circuit-protection devices associated with the cache and/or data registers, those skilled in the art will understand that the present disclosure is applicable to other types of memory circuits such as, for example, circuits that connect to other types of data lines.

In exemplary embodiments of the present disclosure, the circuit-protection subsystem 150 can include a set of one or more protection circuits 210 arranged in a line 212 (e.g., vertically arranged as shown in FIG. 2A) and another set of one or more protection circuits 210 arranged in a line 214 of protection circuits 210. Representative protection circuits 210 are identified by dotted rectangles. Each protection circuit 210 can include a source/drain node 220, a polysilicon gate 215 (also referred to herein as data gate 215), and a source/drain node 222. The node 220 (also referred to herein as low-voltage (LV) node 220) can be coupled to low-voltage circuitry such as data cache 118 and/or data register 120 via, for example, contact 225 ("LV contact 225"). Depending on the memory operation (e.g., erase, read, program, etc.), the node 222 can be coupled to circuitry that can have a relatively high voltage (e.g., about 20V to about 30V during, e.g., erase operation) and/or a relatively low voltage (e.g., about 0V to about 4V during, e.g., read or program operations). In some embodiments, each node 222 (also referred to herein as bit-line (BL) node 222) can be connected to a respective bit line of the memory array 104 via, for example, contact 227 ("BL contact 227"). In operation, the data gates 215 can be turned on to connect LV nodes 220 to BL nodes 222 when low-voltage memory operations, such as, for example, read/program operations, are taking place. When high-voltage memory operations, such as, for example, erase operations, are taking place, the data gates 215 can be turned off to isolate the LV nodes from the high-voltage on the BL nodes 222. As used herein, a BL node and corresponding BL contact can also be referred to herein as BL connection.

Portions of the protection circuits 210 can be respectively formed in individual active regions 228 that are defined by isolation regions 230, e.g., STI regions, formed in the semiconductor. Each active region 228 can include the respective LV node 220, the data gate 215, and can extend to the corresponding BL node 222 surrounding the BL contact 227 (see, e.g., arrows 228 in FIG. 2A). The isolation regions 230 can be formed on either side of one or more active regions 228. Each isolation region 230 electrically isolates and/or physically separates adjacent active regions 228 from each other. The semiconductor may be comprised of silicon, e.g., monocrystalline silicon, and, for example, may be conductively doped to have a conductivity type, e.g., a p-type conductivity, e.g., to form a p-well.

In some embodiments, the circuit-protection subsystem 150 can include an active area 232 that is configured to form one or more transistors, such as, for example, FETs. The active area 232 can be covered by a polysilicon layer that forms a common gate 235 for the one or more transistors that can, in some embodiments, extend beyond the active region 232. In some embodiments, the polysilicon layer can be segmented such that more than one gate (e.g., gates similar to common gate 235) are formed. In some embodiments, the active region 232 can include one or more source (SRC) nodes 237 that can be formed in openings in the polysilicon layer. The SRC nodes 237 can include contacts 239 that can be connected to a voltage source. As used herein, an SRC node and corresponding SRC contact can also be referred to herein as a SRC connection. In some embodiments, the active area 232 can include at least a portion of the BL nodes 222. The one or more transistors defined by the common gate 235 can be configured such that, when the common gate 235 is on, the BL nodes 222 and the one or more SRC nodes 237 are connected and, when the common gate 235 is off, the BL nodes 222 and the one or more source nodes 237 are isolated from each other. In some embodiments, unlike the LV nodes 220, the BL nodes 222 and/or the SRC nodes 237 are not separated from each other by isolation regions (e.g., STI) formed in the semiconductor. Instead, the BL nodes 222 are selectively and electrically coupled to each other and to the one or more SRC nodes 237 by the common gate 235. In some embodiments, active regions 228 can be contiguous with active region 232. That is, active regions 228 may extend from active region 232, as shown in FIG. 2A. When BL nodes 222 are connected to low voltages (e.g., about 0V to about 4V), there is sufficient isolation between the BL nodes 222 when common gate 235 is turned off (e.g., by grounding the common gate contact 237). Accordingly, the need to form isolation regions to create separate active regions for BL nodes 222 and/or the SRC nodes 237 can be avoided.

In some embodiments, similar to the common gate 235, the polysilicon for the data gate 215 can extend beyond the active area 228. During read/program operations, the data gate 215 can be on to selectively couple the corresponding low-voltage circuitry (e.g., data cache 118 and/or data register 120) to the respective bit line via BL node 222 and BL contact 227. During this time, the common gate 235 is off to isolate the BL nodes 222 from the one or more SRC nodes 237, which can be connected to a voltage source via respective SRC contacts 239. During erase operations, the data gate 215 can be off to isolate the low-voltage circuitry (e.g., data cache 118 and/or data register 120) from the respective bit line. During this time, the common gate 235 is on to connect the BL nodes 222 to a voltage source (e.g., a high voltage source) via SRC contacts 239 of the one or more SRC nodes 237. In some embodiments, as shown on FIG. 2B, an n+ mask layer 270 (inner most shaded region) can be used to deposit n+ implant areas around the BL contacts 227 and the SRC contacts 239. The n+ implant area provides a region of low resistivity around the contacts to ensure better and more reliable connections.

As memory devices get smaller and/or denser such as in, for example, 3D NAND devices, it may be desirable to reduce the distance or pitch between the bit-lines of the memory array (e.g., memory array 104). For example, in some memory circuits, the BL contacts are arranged laterally adjacent to each other in a straight line (also referred to herein as "non-offset BL line"). In such systems, the BL pitch is the distance between the BL contacts, and reducing the BL pitch means reducing the distance between the BL contacts. However, the BL contacts may already be at an effective distance that corresponds to a minimum effective distance. As used herein, "effective distance" means the shortest distance between adjacent BL contacts or n+ implants disposed around the adjacent BL contacts, whichever distance is shorter. That is, the effective distance may not necessarily be the shortest distance between the BL contacts themselves. This is because n+ implants have low resistivity, and thus the shortest distance between the n+ implants surrounding the BL contacts can be the limiting factor when reducing the BL pitch. A "minimum effective distance," as used herein, means that a further reduction in the effective distance between the BL contacts will result in adversely affecting BL-BL leakage (isolation) and/or breakdown voltage (BV) to a point where the BL-BL leakage and/or BV falls outside a predetermined design value for the memory device. Bit-line to bit-line leakage affects the ability to properly read data from the bit-line and BV affects the maximum erase voltage and/or gate oxide reliability of the gate. For example, in some memory systems, a BL pitch of 38 nm can correspond to an effective distance of 5.76 nm. However, due to variations in high volume manufacturing, further reductions in the effective distance may not be possible while keeping the BV or the BL-BL leakage within the predetermined design value for the memory device. Thus, in traditional configurations where adjacent BL contacts are disposed along a straight line, once the BL pitch of adjacent BL contacts corresponds to the minimum effective distance and/or falls within variations of high volume manufacturing, there is little or no BL pitch margin to sacrifice and a further reduction in the pitch of the protection circuits may not be achievable without exceeding design criteria with respect to BL-BL leakage and/or BV. For example, it is believed that a BL pitch below 37 nm (corresponding to an effective distance of 5.44 nm) may not be achievable in traditional systems.

In some exemplary embodiments of the present disclosure, a BL contact 227 (and/or corresponding n+ implant) in the circuit-protection subsystem 150 can be located on a non-offset BL line while a laterally adjacent BL contact 227 (and/or corresponding n+ implant) can be disposed in a location that is offset from the non-offset BL line by a predetermined distance (e.g., an offset greater than zero). The predetermined distance or offset can be in a direction that is perpendicular to the non-offset BL line. A direction parallel to the non-offset BL line is referred herein as "width direction" and a direction perpendicular to the non-offset BL line can be referred to herein as "length direction." For clarity, reference to the n+ implant may be omitted in the following description when discussing the BL contacts, but those skilled in the art understand that the BL contacts of the circuit-protection subsystem 150 can have surrounding n+ implants (or p+ implants or another type of doping depending on the type of transistor) in some embodiments. By offsetting some BL contacts 227 in the length direction, a BL pitch ("offset BL pitch") in the width direction between the offset BL contact and a non-offset BL contact can be less than a BL pitch ("non-offset BL pitch") of circuit-protection devices having adjacent non-offset BL contacts. The arrow labeled "P" in FIG. 2A illustrates a BL pitch, which in this case, corresponds to an offset BL pitch because the "B" BL contacts 227 are offset. By offsetting the "B" BL contact 227 (discussed further below), the offset BL pitch (e.g., pitch P) can be less than a non-offset BL pitch and the effective distance can remain the same between the offset and non-offset BL pitches. In some embodiments, the offset BL pitch can be less than the minimum effective distance while keeping the actual effective distance between BL contacts at or above the minimum effective distance.

In some embodiments, more than one "B" BL contact 227 is offset and arranged on an offset bit-line connection line OBL (also referred to herein as "offset BL line OBL") from an adjacent "A" BL contact 227 that is not offset and arranged on a non-offset bit-line connection line NOBL (also referred to herein as "non-offset BL NOBL"). The BL contacts 227 are arranged on the offset BL line OBL and non-offset BL line NOBL so as to form an offset stagger (or zig-zag) pattern along a width direction of circuit-protection subsystem 150. Accordingly, a set of BL contacts can be formed along a non-offset BL line NOBL and another set of BL contacts can be formed along an offset BL line OBL. In some embodiments, a non-offset BL contact and a laterally adjacent offset BL contact can form a repeating alternating pattern. For example, as seen in FIGS. 2A and 2B, the "B" BL contacts 227 (and corresponding BL nodes 222) of protection circuits 210 can be offset by a predetermined distance L1 (also referred to herein as "offset distance L1") in the length-direction with respect to "A" BL contacts 227 (and corresponding BL nodes 222) of laterally adjacent protection circuits 210. In some exemplary embodiments, the BL contacts 227 of every other protection circuit 210 can be disposed at an offset distance L1. However, in other embodiments, other offset distance patterns can be used such as, for example, every second protection circuit 210, every third protection circuit 210, etc. In addition, in the exemplary embodiment of FIG. 2A, only a single offset distance (e.g., offset distance L1) is used in the offset stagger pattern. However, in other embodiments, the BL contacts of the respective protection circuits can be disposed in any number of predetermined offset distance patterns. For example, the protection circuits 210 can be disposed in a staggered pattern (e.g., a repeating staggered pattern) in which a first BL contact has an offset of zero (e.g., on the non-offset BL line NOBL), the next BL contact has a first predetermined offset distance (e.g., offset distance L1), the next BL contact has a second predetermined offset distance (not shown) that is different from offset distance L1 and not zero, etc. In some embodiments, by offsetting the BL contact 227 of one or more protection circuits 210, the length of a circuit-protection subsystem 150 can increase. However, because the pitch of the one or more protection circuits 210 can be reduced by offsetting the BL contacts, the overall area of the circuit-protection subsystem 150 can be reduced despite a possible increase in the length. In addition, because the offset pitch is reduced in comparison to a non-offset BL pitch, the memory array 104 can be denser and/or more memory cells can be added while shrinking the physical size of the memory array 104 (or, at a minimum, without increasing the physical size of the memory array 104). By arranging the BL contacts 227 to have an offset stagger pattern, the offset BL pitch of the protection circuits 210 can be reduced in comparison to a non-offset BL pitch while keeping the same effective distance between adjacent BL contacts 227. In some embodiments, while keeping the effective distance between adjacent BL contacts 227 at or greater than the minimum effective distance, the BL pitch can be reduced to a value that is less than 37 nm, less than 36 nm, between 35 nm to 37 nm, or between 35 nm to 36 nm. In some embodiments, while keeping the effective distance between adjacent BL contacts 227 at or greater than the minimum effective distance, the BL pitch can be reduced to a value that is less than the minimum effective distance.

In some embodiments, the offset distance L1 is set such that the effective distance D1 (see FIG. 2B) between one or more adjacent BL contacts 227 (e.g., between an offset BL contact and a non-offset BL contact) equals the minimum effective distance. In some embodiments, the offset distance L1 is set such that the effective distance D1 is in a range of 5 nm to 7 nm. As seen in FIG. 2B, the BL contacts 227 are formed in an area having rectangular cutouts in the polysilicon of the common gate 235. In the exemplary embodiment of FIG. 2B, the effective distance D1 is measured from a corner of an n+ implant of a non-offset BL contact 227 to the nearest corner of an n+ implant of an offset BL contact 227. Of course, the polysilicon cutout shapes are not limited to rectangular shapes and can include other shapes such as, for example, circles, ovals, triangles, etc. In some embodiments, the offset distance L1 is set such that an effective distance D2 between SRC contact 239 and one or more adjacent offset BL contacts 227 equals or exceeds the minimum effective distance. In some embodiments, the offset distance L1 is set such that the effective distance D2 is in a range of 5 nm to 7 nm. The effective distance D2 can be an outer part (e.g., corner or another part of the perimeter) of an n+ implant of an SRC contact 239 to the nearest outer part (e.g., corner or another part of the perimeter) of an adjacent n+ implant of an offset BL contact 227.

In some embodiments, the offset distance L1 is set such that the effective distance D1 equals or exceeds the minimum effective distance and the length AA1 of the active area 232 is set such that the effective distance D2 equals or exceeds the minimum effective distance. However, in some embodiments, to maintain an effective distance D2 that is at or greater than the minimum effective distance, SRC nodes 237 can be selectively formed in regions of the common gate 235 that allow for an effective distance that equals or exceeds the minimum effective distance. For example, as seen in FIGS. 2A and 2B, the SRC nodes 237 can be disposed in locations where the opposing BL contacts 227 (and corresponding BL nodes 222) are not offset (e.g., "A" BL contacts 227). The number of SRC nodes 237 and the corresponding SRC contacts 239 can depend on factors such as number of individual polysilicon gates that form the continuous common gate 235, the number of BL nodes 222 that are offset, the resistivity of the SRC contact 239 connections to the common gate 235, and/or reliability of the SRC contact 239 connections to the common gate 235. The number of SRC nodes 237 can be equal to or more than the number of BL nodes 222. However, in other embodiments, the number of source nodes 237 can be less than the number of BL nodes 222. For example, in the embodiment of FIGS. 2A and 2B, the number of SRC nodes 237 will be about 25% of the number of BL nodes 222.

FIG. 2B illustrates an exemplary embodiment of an n+ mask used to form the n+ implants around BL contacts 227 and the SRC contacts 239. The n+ mask layer 270 is overlapped by the polysilicon gate 235. In some exemplary embodiments, the n+ mask layer 270 can have a staggered configuration that corresponds to the offset staggered pattern of the BL contacts 227. For example, as seen in FIG. 2B, the n+ mask layer 270 has an edge outline 272 (e.g., a step-wise edge outline) that matches the offset stagger pattern on the BL contacts 227 of nodes 222. Based on the n+ mask layer 270, the area around the location of one or more BL contacts 227 and/or one or more SRC contacts 239 will include an n+ implant. By configuring the edge of the n+ mask layer 270 to match the offset stagger of the BL contacts 227, a distance D3 from the BL contacts 227 to an exposed silicon portion of the node 222 remains constant between offset and non-offset BL nodes 222 of protection circuits 210.

As best seen in FIG. 2B, in some embodiments, the edge 229 of the active areas 228 that are adjacent to the active area 232 can be formed to match the stagger (e.g., offset) of the active area 232 and/or the BL contacts 227. For example, the edge 229 can be formed under the polysilicon of the common gate 235 between the fingers 236 of the common gate 235 such that a distance D4 from the BL contacts 227 to the edge 229 of the active area 228 for each of the protection circuits 210 is at a same value. In some embodiments, similar to the edge 229 of the active area 228, the polysilicon edges 237 of the common gates 235 can also have a pattern that corresponds to the offset stagger pattern of the BL nodes 222 and/or BL contacts 227. Accordingly, in such embodiments, similar to the distance D4, a distance from the BL contact 227 to the polysilicon edge 236 of the respective common gates 235 can be the same for each protection circuit 210.

In some embodiments, a distance D5 from the BL contacts 227 to the data gate 215 can be equal between the protection circuits 210 in order to keep the total resistance of the BL nodes 222 (e.g., resistance from the data gate 215 to the respective BL contact 227) equal among the protection circuits 210. Accordingly, in some embodiments, the position of one or more data gates 215 can also be staggered by an offset distance (e.g., offset distance L1) that matches the offset stagger pattern of the respective BL contacts 227.

In some embodiments, if the data gates 215 are staggered, the LV nodes 220 and/or LV contacts 225 can also be staggered (not shown) so that the length of the LV nodes 220 and/or resistance of the LV nodes 220 can be set equal to each other. That is, the length of the LV nodes 220 and data gate 215 can be equal in some embodiments. In some embodiments (e.g., as shown in FIG. 2A), the LV nodes 220 and the contacts 225 are disposed in a straight line (e.g., not staggered) but the data gates 215 are staggered. Accordingly, to the extent equal resistance between the low-voltage nodes 220 is desired, the LV node 220 can be configured (e.g., composition or a physical dimension such as length, width, etc.) such that the resistance value is equal among the protection circuits 210.

Figure 3B:
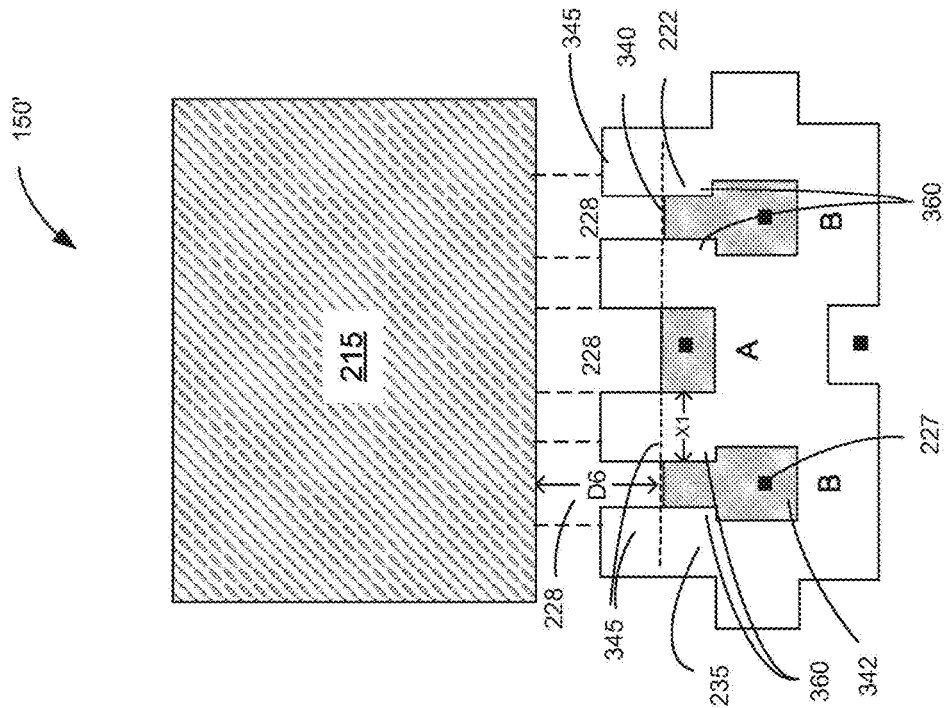
FIGS. 3A to 3C illustrate top views of simplified block diagrams of portions of protection circuits in accordance with the present disclosure.
Figure 3A:
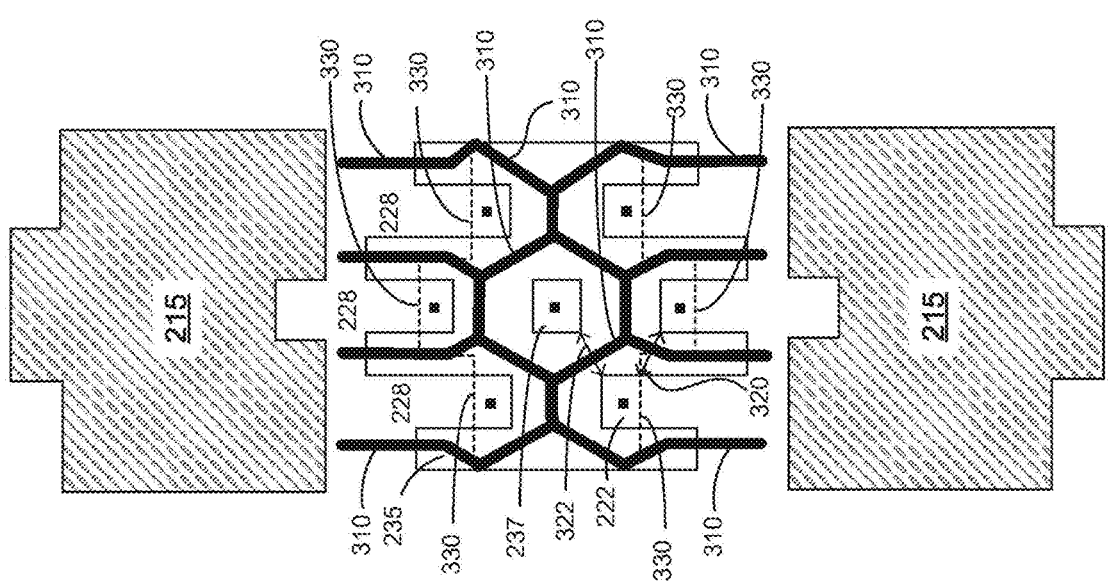

FIG. 3A illustrates a simplified block diagram of a portion of the circuit-protection subsystem 150 that includes blocks representing the data gates 215 and a simplified section illustrating the common gate 235. As seen in FIGS. 2A and 3A, the protection circuit 210 are mirrored along a centerline of the circuit-protection subsystem 150 containing the common gate 235. In this embodiment, the n+ implant in the BL nodes 222 are equal due to the step-wise (or staggered) n+ mask edge 330. Accordingly, the active areas 228 can also be staggered to maintain an equal resistance as discussed above. As seen in FIG. 3A, the common gate section 235 includes one or more p-well implant layers 310. The p-well implant layers 310 can be disposed between the BL nodes 222 and/or the SRC nodes 237 and serve to define the boundaries between the BL nodes 222 and/or the boundaries between BL nodes 222 and the SRC nodes 237. In some embodiments, the p-well implant layers 310 are disposed perpendicular to a line corresponding to the effective distance between the n+ implants of adjacent BL nodes 222 (e.g., line 320) and/or a line corresponding to the shortest distance between the n+ implants of SRC node 237 and an adjacent BL node 222 (e.g., line 322). In other embodiments (not shown), the p-well implants are disposed in straight lines between the BL nodes 222 and/or between BL nodes 222 and the SRC nodes 237 so that the p-well implants intersect at 90-degrees to each other. A portion of p-well implant layer 310 can be doped (e.g., lightly doped) to have p-type conductivity, where the doped portion has a desired threshold voltage (Vt) for the channel of the field-effect transistor formed between the BL nodes 222 and/or the channel of the field-effect transistor formed between the BL nodes 222 and the SRC node 237.

FIG. 3B illustrates a simplified block diagram of a portion of another embodiment of the circuit-protection subsystem. The circuit-protection subsystem 150' includes a block illustrating the data gates 215 and a simplified section illustrating a portion of the common gate 235. In this embodiment, the n+ mask layer 340 is configured so as to have a straight edge (see dotted line). Accordingly, unlike the embodiment of FIG. 3A, the edge of the n+ mask layer 340 does not include a stagger that matches the offsets of the "B" BL nodes 222. Because of the straight edge, the n+ implant distribution 342 (see shaded region) in each of the of BL nodes 222 are not equal and the distance from the BL contacts 227 to the edge of the n+ mask layer 340 will be different. However, because the BL nodes 222 include a highly doped n+ implant area 342, any difference in the resistances from the BL contact 227 to edge the n+ mask layer 340 between the protection circuits 210 is negligible. That is, only the resistance of the non-n+ doped regions of the active area 228 can be considered when configuring the protection circuits. Accordingly, in some embodiments, the protection circuits 210 can be configured such that the data gates 215 are not staggered and a distance D6 between the data gates 215 and the edge of the n+ mask layer 340 is set to be the same for each of the protection circuits 210. The length from the BL contact 227 and the exposed portion of the active area 228 and/or to the data gates 215 not set to be equal, but this is not a problem because the n+ implant areas have negligible differences in resistance. Of course, to the extent the resistance of the active areas 228 would benefit from further equalization between the protection circuits 210, the geometry (e.g., width, length, and/or shape) and/or composition (e.g., n/p doping) of each active area 228 can be changed such that the resistances are equal.

As discussed above, in some embodiments, the edge of the n+ implant layer 340 is not staggered to match a stagger of the BL contacts 227. In such embodiments, however, it is possible that the effective distance between adjacent BL contacts 227 may no longer be a limiting dimension with respect to the pitch of the protection circuit 210. Instead, in some embodiments, it is possible that a distance X1 between the BL nodes 222 in the fingers 345 is configured to be at or greater than the minimum effective distance in order to ensure that the bit-line to bit-line isolation and/or breakdown voltage falls within a predetermined design value for the memory device. Accordingly, to ensure the distance X1 is at or greater than the minimum effective distance, the polysilicon of the common gate 235 can extend into the active area 228 of the offset BL nodes 222. For example, as seen in FIG. 3B, polysilicon tabs 360 extend into the active areas 228 of the "B" or non-offset protection circuits 210 to ensure the distance X1 is at or greater than the minimum effective distance.

Figure 3D:
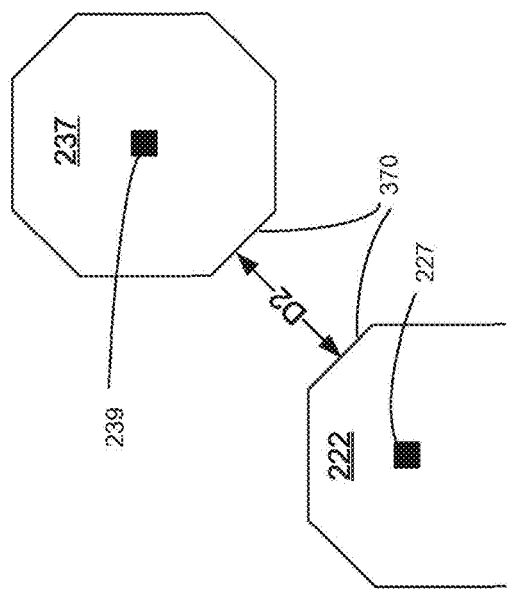
FIG. 3D illustrates an alternate configuration for bit-line nodes and source nodes in accordance with the present disclosure.
Figure 3C:
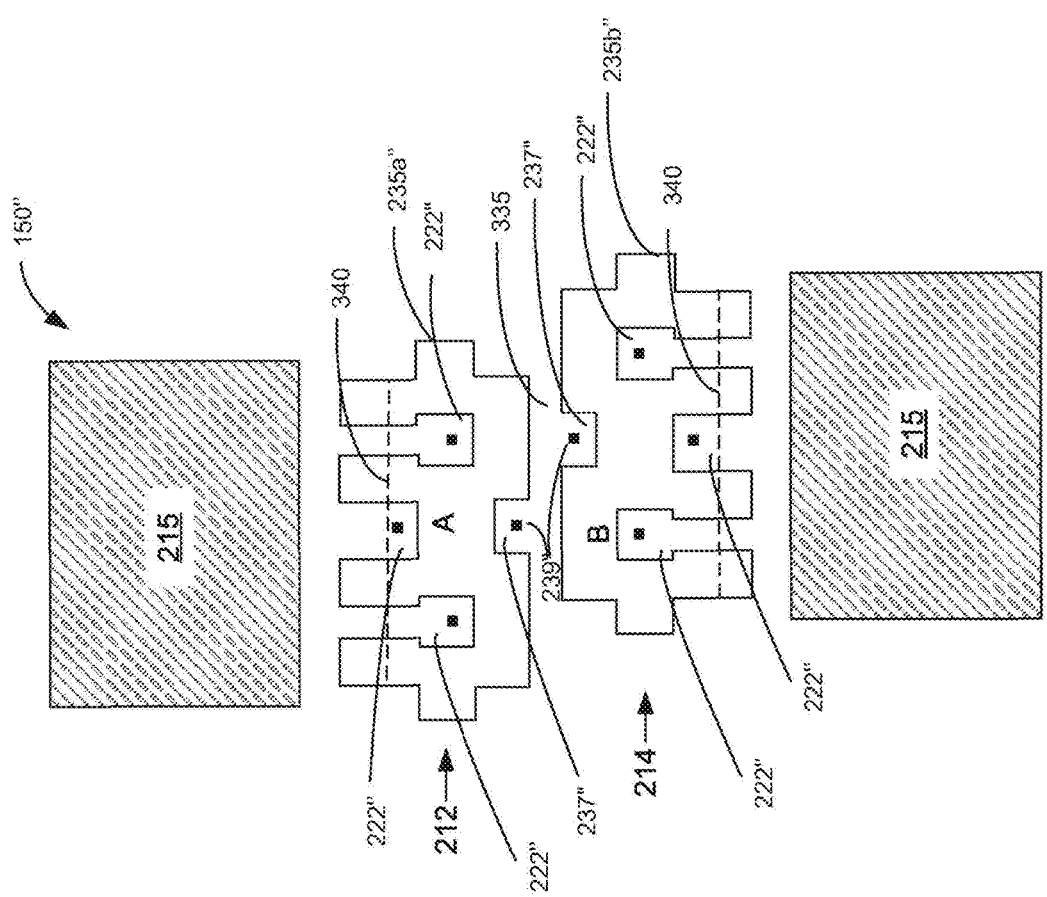

FIG. 3C illustrates another embodiment of the present disclosure. The embodiment in FIG. 3C is similar to the embodiment of FIG. 3B with respect to the n+ mask layer, which has a straight edge 340. However, instead of a single polysilicon gate (e.g., common gate 235), the circuit-protection subsystem 150" includes a shared gate 235a" for the protection circuits 210 in line 212 and a shared gate 235b" for the protection circuits 210 in line 214. The shared gates 235a" and 235b" can be disposed on either side of a continuous source area 335 that is disposed between the protection circuits 210 of line 212 and the protection circuits 210 of line 214. In some embodiments, the continuous source area 335 can be doped with an n+ implant layer. In some embodiments, the protection circuits 210 on one side of the continuous source area 335 can be offset in comparison to the protection circuits 210 on the other side of the continuous source area 335. In some embodiments, the offset of the protection circuits is such that a non-offset BL node 222 of the shared gate 235a" is aligned with an offset BL node 222 of the shared gate 235b" and vice versa. That is, the protection circuits 210 in the circuit-protection subsystem 150" are not mirrored along a centerline extending through the SRC nodes 237 like in circuit-protection subsystem 150 discussed above. In some embodiments, each of the shared gates 235a" and 235b" can include one or more SRC nodes 237", with each SRC node 237" having a contact 239". In some embodiments, one or more SRC nodes 237" with the respective SRC contacts 239" can be disposed in the continuous source area 335 between opposing offset/non-offset pairs of BL nodes 222". For example, as seen in FIG. 3C, an SRC node 237" can be disposed between a non-offset BL node 222" and an offset BL node 222" on the opposing shared gate. In some embodiments, the continuous source area 335 and/or the SRC nodes 237" include an n+ implant. By using an offset configuration for the opposing protection circuits 210, an SRC node 237 with corresponding SRC contact 239 can be disposed between every pair of opposing protection circuits 210. Thus, while circuit-protection subsystem 150" may be larger than circuit-protection subsystems 150 and 150', the greater number of source contacts in circuit-protection subsystem 150" can provide more reliability. FIG. 3C shows a configuration in which a continuous source area 335 is added to circuit-protection subsystem 150" that is similar in configuration to circuit-protection subsystem 150'. However, those skilled in the art will understand that a continuous source area 335 can also be added to a circuit-protection device that is similar in configuration to circuit-protection subsystem 150. In addition, those skilled in the art will understand that the other features of circuit-protection devices 150 and/or 150', discussed above, as be included in circuit-protection subsystem 150", as appropriate, and thus, for brevity, will not be repeated.

In the embodiments discussed above, the openings in the polysilicon layer for the BL contacts and SRC contacts are shown having shapes with right-angles (e.g., rectangles or a portion thereof). However, the openings can have other types of shapes, such as for example, multi-sided shapes, circles, ovals, portions thereof, etc. For example, as seen in FIG. 3D, in some embodiments, the opening in the polysilicon for BL contact 227 and/or SRC contact 239 can include facets 370. The facets 370 can be disposed so as to increase the effective distance between adjacent BL contacts 227 (not shown) and/or the effective distance D2 between the BL contact 227 and the SRC contact 239 in comparison to openings that have right-angles as shown in FIGS. 2A and 2B.

In some 3D-type memory devices, memory subsystems including control logic (e.g., control logic 116) and/or page buffers (e.g., cache register 118) can be disposed under the memory array (e.g., memory array 104). This arrangement, known as CMOS under array (CUA), allows the memory subsystem to be smaller than systems in which the control logic and page buffer are located adjacent to the memory array. However, even configured as a CUA, there can be a limit with respect to how much smaller a memory device can get due to how some cache memory latches are fabricated. In some cache memory latches, the NMOS and PMOS components (e.g., p-channel low-voltage PLV and n-channel low-voltage NLV) of the CMOS inverters that make up the latch are formed in separate wells. Even though the wells may be closely spaced, the spacing requirements for the components will mean a greater area for the CMOS inverters than if the components are formed in the same well. The separate remote wells also mean that the metal routing between the components can get congested and complicates the ability to shrink the CUA.

To reduce the pitch of the latches and thus the size of the page buffer, exemplary embodiments of the present disclosure include integrated CMOS inverters that can be incorporated into a NAND latch to create a memory cell (e.g., an SRAM cell). The integrated CMOS inverter can include a PMOS transistor and an NMOS transistor that share a common active area. Because the NMOS and/or PMOS transistors are floating body, an n-well implant is not needed. Accordingly, the integrated CMOS inverter uses less space than a traditional CMOS inverter. In some embodiments, the PMOS transistor and/or the NMOS transistor can be formed as a vertical transistor. In some embodiments, the integrated CMOS inverter can include a common gate, which can eliminate the need to connect the separate gates of each component. When one or both transistors are vertical, the integrated CMOS inverter of the present disclosure allows for neighboring CMOS inverters to be in close proximity without concern for polysilicon-polysilicon spacing of the gate end caps. Thus, the need for gaps between gate end caps (nibbles) that can exist in traditional page buffer latch layouts can be eliminated.

Figure 4A:
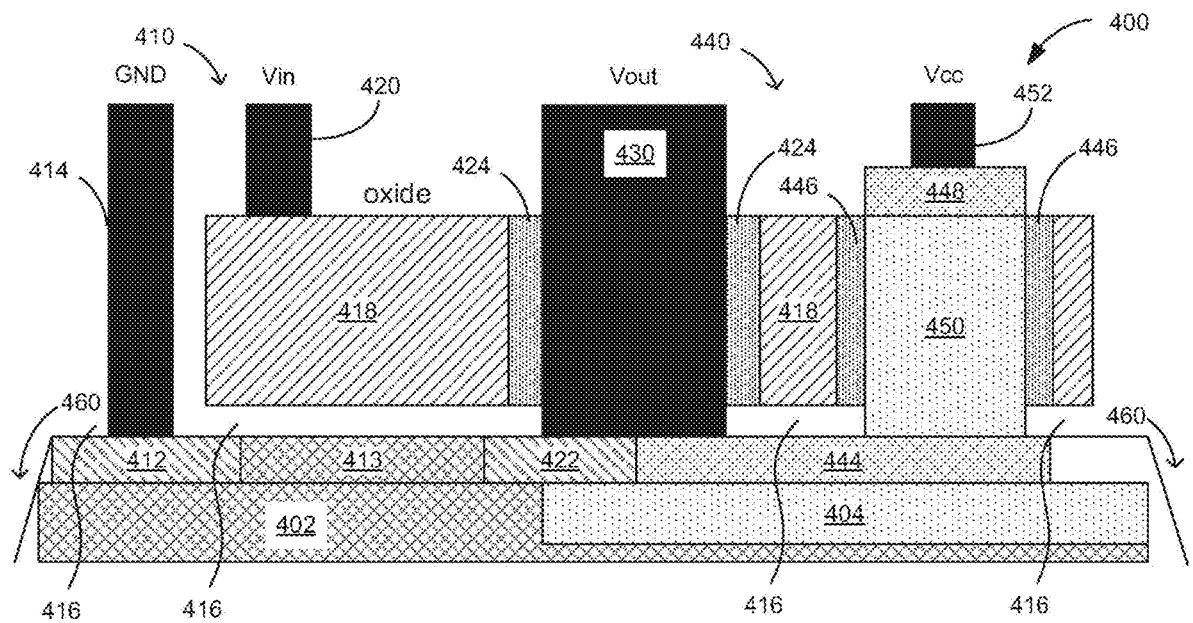
FIGS. 4A and 4B illustrate side and top views of an integrated planar NMOS-vertical PMOS inverter in accordance with the present disclosure.

FIG. 4A illustrates a cross-sectional view of an integrated inverter 400 that includes a planar NMOS transistor 410 and a vertical PMOS transistor 440 with a common output contact 430. The integrated inverter 400 can be disposed on a silicon substrate 402. The active area of the integrated inverter 400 is common to both the NMOS and PMOS transistors and can be defined by shallow-trench isolation 460 on each side of the integrated inverter 400. As seen in FIG. 4A, the NMOS transistor 410 includes an NMOS source 412 and a NMOS drain 422, which can be an n+ diffusion layers disposed into the silicon substrate 402. One or more metal layers (e.g., a tungsten layers) can be disposed on the NMOS source 412 to create an NMOS source contact 414. One or more metal layers (e.g., a tungsten layers) can be disposed on the NMOS drain 422, and the metal layer(s) can also connect to the PMOS drain 444 to form a common output contact 430. A channel 413 can be disposed between NMOS source 412 and NMOS drain 422. A portion of channel 413 can be doped with a different (e.g., higher) conductivity than that of the p-type substrate 402 such that the doped portion has a desired threshold voltage (Vt). The NMOS source 412 can be connected to ground potential GND via the NMOS source contact 414. The NMOS transistor 410 can also include a silicon oxide layer 416 disposed above the source 412 and drain 422. Between source 412 and the drain 422, the silicon oxide layer 416 acts as the gate oxide for the planar NMOS transistor. The silicon oxide layer 416 can be deposited on the silicon substrate 402 so as to surround the metal layer 414. In addition, one or more silicon oxide layers can be disposed on the silicon oxide layer 416 so as to isolate the metal layer 414 from the surrounding components. A gate 418 comprised of one or more layers of polysilicon and/or WSix (tungsten silicide) can be disposed on top of the silicon oxide layer 416. In some embodiments, the gate 418 can have a gate-all-around (GAA) design that is common to both the planar NMOS transistor 410 and the vertical PMOS transistor 440. One or more metal layers (e.g., a tungsten layers) can be disposed on the common gate 418 to serve as the input contact 420 (Vin) to the inverter 400.

The vertical PMOS transistor 440 includes a PMOS source 448, which can be an p+ implant layer, disposed on a channel 450. The channel 450 can be comprised of one or more layers of polysilicon, which can be n-type polysilicon. The channel 450 can be disposed on a PMOS drain 444, which can be a p+ diffusion layer. The PMOS drain 444 can be formed on an n-type diffusion layer 404, which can be formed on the substrate 402. The PMOS drain 444 can connect to the common output contact 430, which can be made of one or more metal layers (e.g., a tungsten layers). Thus, the common output contact 430 connects to both the NMOS drain 422 and the PMOS drain 444. The silicon oxide layer 416 can be deposited on the silicon substrate 402 so as to surround the metal of the common output contact 430. In addition, one or more silicon oxide layers 424 can be disposed on the silicon oxide layer 416 so as to surround the common output 430 and isolate the common output 430 from the common gate 418. In some embodiments, the composition of the silicon oxide layer 424 and the silicon oxide layer 416 can be the same. One or more metal layers (e.g., a tungsten layer) can be disposed on the PMOS source 448 to serve as the PMOS source contact 452. The PMOS source 448 can be connected to Vcc potential (e.g., 3.5 volts) via the PMOS source contact 452. The silicon oxide layer 416 can be disposed on the silicon substrate 402 so as to surround the channel 450. One or more lateral gate oxide layers 446 can be disposed on the silicon oxide layer 416 so as to surround the channel 450 (see also FIG. 4B). In some embodiments, the composition of the lateral gate oxide layer 446 and the silicon oxide layer 416 can be the same.

Figure 4B:
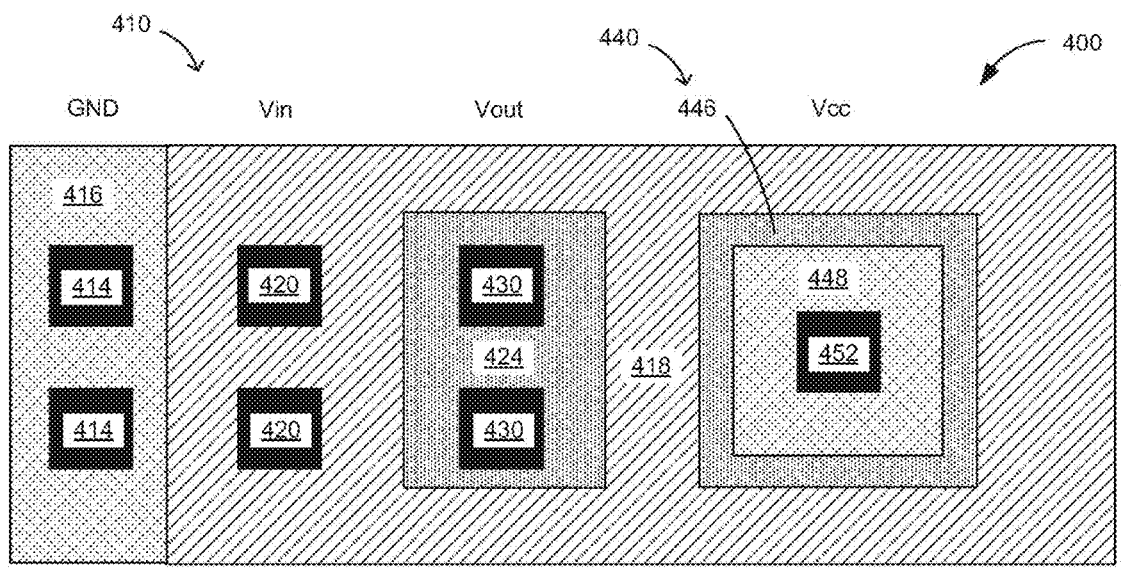

FIG. 4B is a top view of the inverter 400. As seen FIG. 4B, the GAA-type gate 418 covers nearly all of the inverter 400. The inverter 400 can be configured with one or more NMOS source contacts 414, which can be isolated from the gate 418 by one or more silicon oxide layers 416. In the embodiment of FIG. 4B, there are two contacts 414, but any number of contacts can be used based on design resistivity, reliability of the connections and complexity of the connections. For example, if only one contact is used and it is defective, the inverter 400 and, thus the memory cell, will be unusable. However, forming a large number of contacts may not be economical or technically feasible. Similarly, although shown with two contact each, there can be one or more contacts formed for the input contact 420 and/or common output contact 430. The input contacts 420 are connected to the gate 418, while the common output contacts 430 are isolated from the gate 418 by one or more silicon oxide layers 424. As shown in FIG. 4B, a single PMOS source contact 452 is formed on the vertical PMOS transistor 440. However, in some embodiments, more than one PMOS source contact can be formed. The PMOS source 448 is shown having a rectangular column (e.g., square column) shape in FIGS. 4A and 4B. The channel 450, which is hidden, can also have a rectangular column (e.g., square column) shape. However, the PMOS source 448 and/or the channel 450 can have other shapes such as, for example, a cylindrical column shape. One or more gate oxide layers 446 can surround the channel 450 to isolate the channel 450 from the common gate 418 (see also FIG. 4A). The gate oxide layers 446 can have a geometry that corresponds to that of the channel 450. For example, if the channel 450 is a rectangular column, the gate oxide layers 446 can be a rectangular tube, if the if the channel 450 is a cylindrical column, the gate oxide layers 446 can be a cylindrical tube, and so on.

In operation, when the input contact 420 (Vin) has a high signal (e.g., high potential), the GAA-type common gate 418 is also at a high potential. With the gate 418 high, the planar NMOS transistor 410 is on and vertical PMOS transistor 440 is off. With NMOS transistor 410 on, the NMOS source 412, which is at ground potential GND via NMOS source contact 414, is connected to common output contact 430 (Vout) via channel 413 and NMOS drain 422. Accordingly, when the input contact 420 (Vin) has a high signal, the common output contact 430 (Vout) has low signal. When the input contact 420 (Vin) has a low signal (e.g., low potential), the gate 418 is also at a low potential. With the gate 418 low, the planar NMOS transistor 410 is off and vertical PMOS transistor 440 is on. With PMOS transistor 410 on, the PMOS source 448, which is at Vcc potential via PMOS source contact 452, is connected to the common output contact 430 (Vout) via channel 450 and PMOS drain 444. Accordingly, when the input contact 420 (Vin) has a low signal, the common output contact 430 (Vout) has high signal. Thus, the planar NMOS-vertical PMOS inverter 400 will behave similar to a traditional planar NMOS-planar PMOS inverter but will take up less space because, unlike all-planar CMOS inverters, separate wells are not needed. Although a planar NMOS and a vertical PMOS is described above, those skilled in the art understand that a planar PMOS and a vertical NMOS will have a similar configuration but with the p-type implants and n-type implants reversed. Accordingly, for brevity, a discussion of an inverter with a planar PMOS and a vertical NMOS is omitted.

Figure 5A:
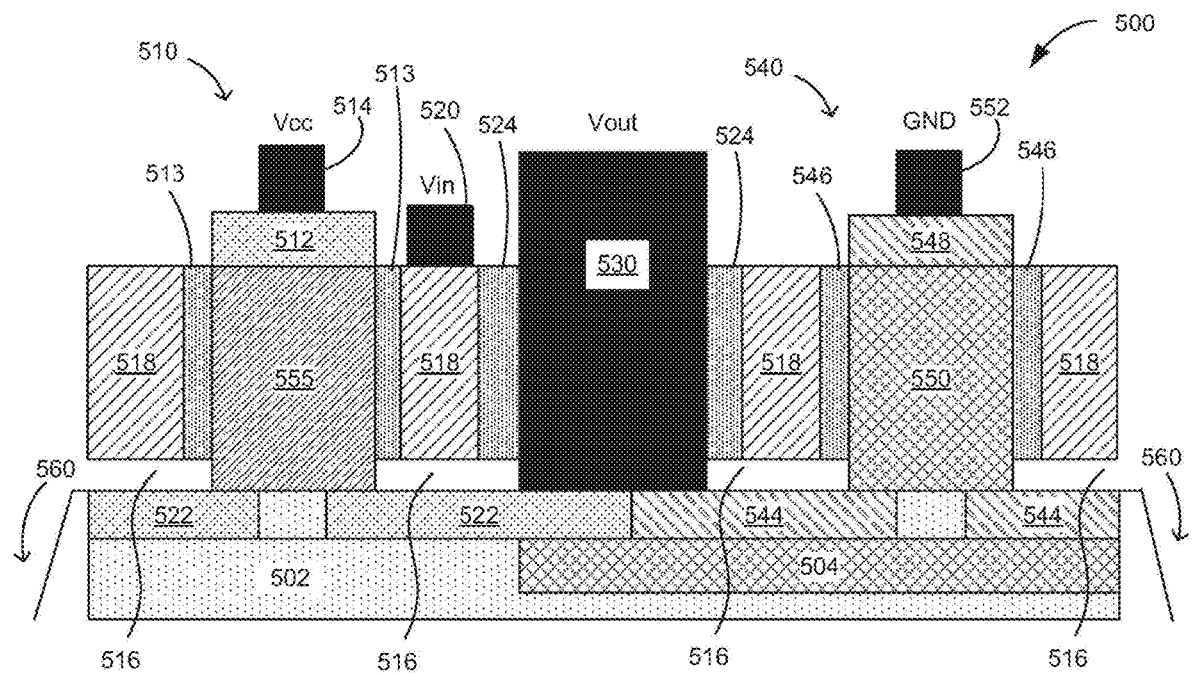
FIGS. 5A and 5B illustrate side and top views of an integrated vertical CMOS inverter in accordance with the present disclosure.

FIG. 5A illustrates a cross-sectional view of an integrated inverter 500 that includes a vertical PMOS transistor 510 and a vertical NMOS transistor 540. The integrated inverter 500 can be disposed on a silicon substrate 502. The active area of the integrated inverter 500 is common to both the PMOS and MMOS transistors and can be defined by shallow-trench isolation 560 on each side of the integrated inverter 500. The vertical PMOS transistor 510 and a vertical NMOS transistor 540 include a common output contact 530 and a common gate 518. The vertical PMOS transistor 510 includes a PMOS source 512, which can be an p+ implant layer, disposed on a channel 555. The channel 555 can be comprised of one or more layers of polysilicon, which can be n-type polysilicon. The channel 555 can be disposed on a PMOS drain 522, which can be a p+ diffusion layer disposed into the silicon substrate 502, which can be an n-type well. The silicon oxide layer 516 can be disposed on the silicon substrate 502 so as to surround the channel 555. The PMOS drain 522 and an NMOS drain 544 can be connect to a common output contact 530, which can be made of one or more metal layers (e.g., a tungsten layers). Thus, the common output contact 530 connects to both the PMOS drain 522 and the NMOS drain 544. The silicon oxide layer 516 can be deposited on the silicon substrate 502 so as to surround the metal of the common output contact 530. In addition, one or more silicon oxide layers 524 can be disposed on the silicon oxide layer 516 so as to surround the common output 530 and isolate the common output 530 from a common gate 518. In some embodiments, the composition of the silicon oxide layer 516 and the silicon oxide layers 524 can be the same. One or more metal layers (e.g., a tungsten layer) can be disposed on the PMOS source 512 to serve as the PMOS source contact 514. The PMOS source 512 can be connected to Vcc potential (e.g., 3.5 volts) via the PMOS source contact 514. One or more lateral gate oxide layers 513 can be disposed on the silicon oxide layer 516 so as to surround the channel 555. The common gate 518 can be comprised of one or more layers of polysilicon and/or WSix (tungsten silicide). The common gate 518 can be disposed on top of the silicon oxide layer 516. The common gate 518 can be a gate-all-around design. One or more metal layers (e.g., a tungsten layers) can be disposed on the GAA-type gate 518 to serve as the input contact 520 (Vin) to the inverter 500.

The vertical NMOS transistor 540 of the integrated inverter 500 includes an NMOS source 548, which can be an n+ implant layer, disposed on a channel 550. The channel 550 can be comprised of one or more layers of polysilicon, which can be p-type polysilicon. The channel 550 can be disposed on an NMOS drain 544, which can be a n+ diffusion layer disposed into a p-type diffusion layer 504. The p-type diffusion layer 504 can be disposed in the silicon substrate 502. The NMOS drain 544 can be connected to the common output contact 530. One or more metal layers (e.g., a tungsten layer) can be disposed on the NMOS source 548 to serve as the NMOS source contact 552. The NMOS source 548 can be connected to ground potential (GND) via the NMOS source contact 552. The silicon oxide layer 516 can be disposed on the silicon substrate 502 so as to surround the channel 550. One or more lateral gate oxide layers 546 can be disposed on the silicon oxide layer 516 so as to surround the channel 550.

Figure 5B:
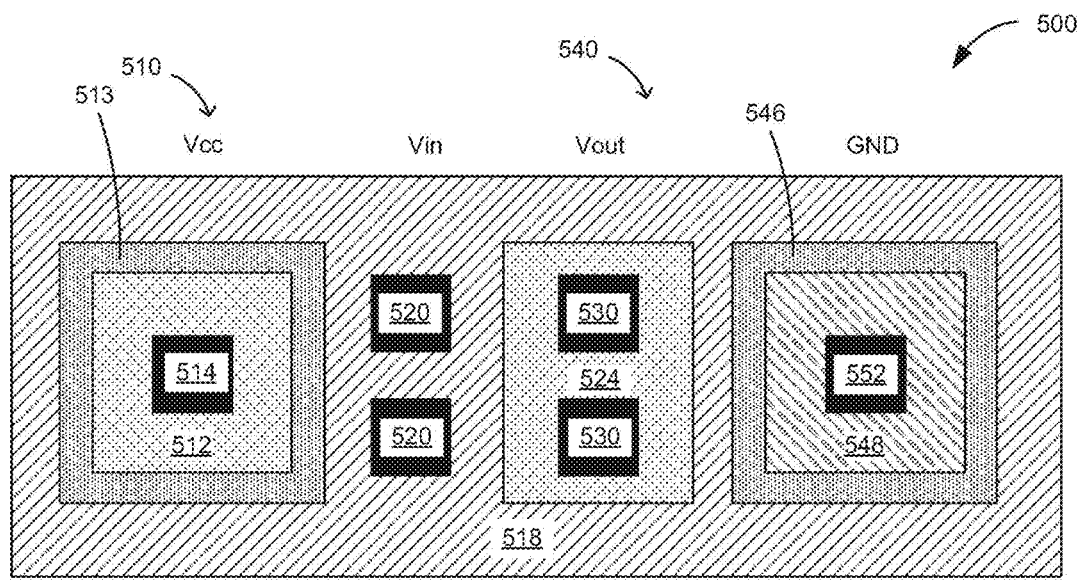

FIG. 5B is a top view of the inverter 500. As seen FIG. 5B, the GAA-type gate 518 covers nearly all of the inverter 500.

The inverter 500 can be configured with a single PMOS source contacts 514 that is formed on the vertical PMOS transistor 510. However, in some embodiments, more than one PMOS source contact can be formed. That is, while there is one contact shown in FIG. 5B, any number of contacts can be used based on design resistivity, reliability of the connections and complexity of the connections. Similarly, although shown with two contacts each, there can be one or more contacts formed for the input contact 520 and/or common output contact 530. The input contacts 520 are connected to the gate 518, while the common output contacts 530 are isolated from the gate 518 by one or more silicon oxide layers 524. As shown in FIG. 5B, a single NMOS source contact 552 is formed on the vertical NMOS transistor 540. However, like the PMOS source contact, in some embodiments, more than one NMOS source contact can be formed. The PMOS source 512 and the NMOS source 548 are shown having a rectangular column (e.g., square column) shape in FIGS. 5A and 5B. One or both of the respective channels 555 and 550, which are hidden under the sources 512 and 548, can also have rectangular column (e.g., square column) shapes. However, one or both of the PMOS source 512 and the NMOS source 548 and/or one or both of the channels 555 and 550 can have other shapes such as, for example, cylindrical column shapes. One or more gate oxide layers 513 and 546 can surround the respective channels 555 and 550. Of course, the gate oxide layers 513 and 546 can have geometries that correspond to the respective channels 555 and 550. For example, if one or both of the channels 555, 550 has a rectangular column configuration, the respective gate oxide layers 513, 546 can be a rectangular tube, if one or both of the channels 555, 550 has a cylindrical column configuration, the respective gate oxide layers 513, 546 can be a cylindrical tube, and so on.

In operation, when the input contact 520 (Vin) has a high signal (e.g., high potential), the GAA-type common gate 518 also has a high potential. With the common gate 518 high, the NMOS transistor 540 is on and the PMOS transistor 510 is off. With the NMOS transistor 540 on, the NMOS source 458, which is at ground potential GND via PMOS source contact 552, is connected to the common output contact 530 (Vout) via channel 550 and PMOS drain 544. Accordingly, when the input contact 520 (Vin) has a high signal, the common output contact 530 (Vout) has a low signal. When the input contact 520 (Vin) has a low signal (e.g., low potential), the gate 518 also has a low potential. With the common gate 518 low, the NMOS transistor 540 is off and the PMOS transistor 510 is on. With the PMOS transistor 510 on, the PMOS source 512, which is at Vcc potential via PMOS source contact 514, is connected to common output contact 530 (Vout) via channel 555 and PMOS drain 522. Accordingly, when the input contact 520 (Vin) has a low signal, the common output contact 530 (Vout) has a high signal. The vertical NMOS-vertical PMOS inverter 500 as disclosed above will behave similar to a traditional planar NMOS-planar PMOS inverter but will take up less space because separate wells are not needed. While a vertical-vertical inverter (e.g., inverter 500) can be more compact than a planar-vertical (e.g., inverter 400), in some cases inverter 400 can be more economical. Because one of the inverters is planar, a portion of the traditional fabrication process can be used when manufacturing planar-vertical inverters.

Figure 6A:
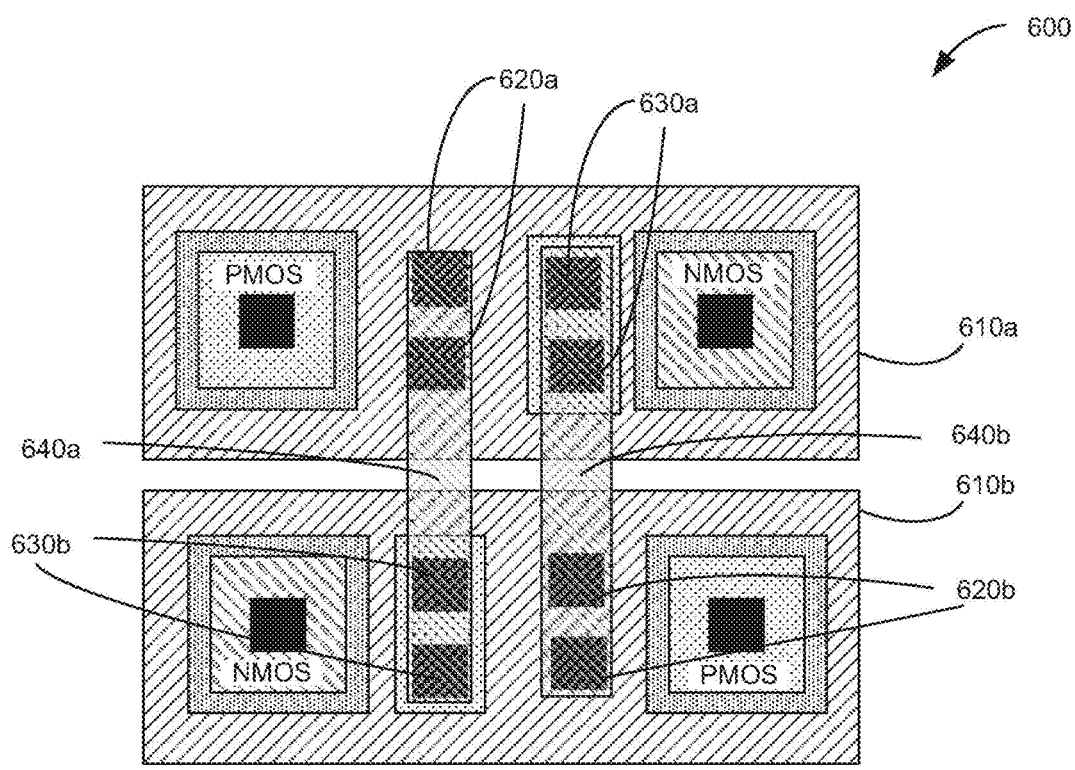
FIGS. 6A to 6D illustrate top views of inverter interconnection that are in accordance with the present disclosure.

FIG. 6A illustrates a memory cell 600, e.g., an SRAM cell, having two integrated inverters 610*a,b* that can be, for example, the same as inverter 500 having a PMOS transistor and an NMOS transistor, as discussed above. As seen in FIG. 6A, the integrated inverters 610*a,b* are oriented such that the input contact(s) 620*a* of inverter 610*a* aligns (e.g., linearly aligns) with the output contact(s) 630*b* of inverter 610*b*, and the input contact(s) 620*b* of inverter 610*b* aligns (e.g., linearly aligns) with the output contact(s) 630*a* of inverter 610*a*. In some embodiments, conductive contact strips 640*a* and 640*b* (e.g., metal layers) can be disposed such that the input contact(s) 620*a* and 620*b* are connected to output contacts 630*b* and 630*a*, respectively. By using an integrated inverter configuration, the routing of the contact strips between the connections of the inverters is direct (e.g., linear) and less congested, which allows for a more compact cache configuration.

Figure 6B:
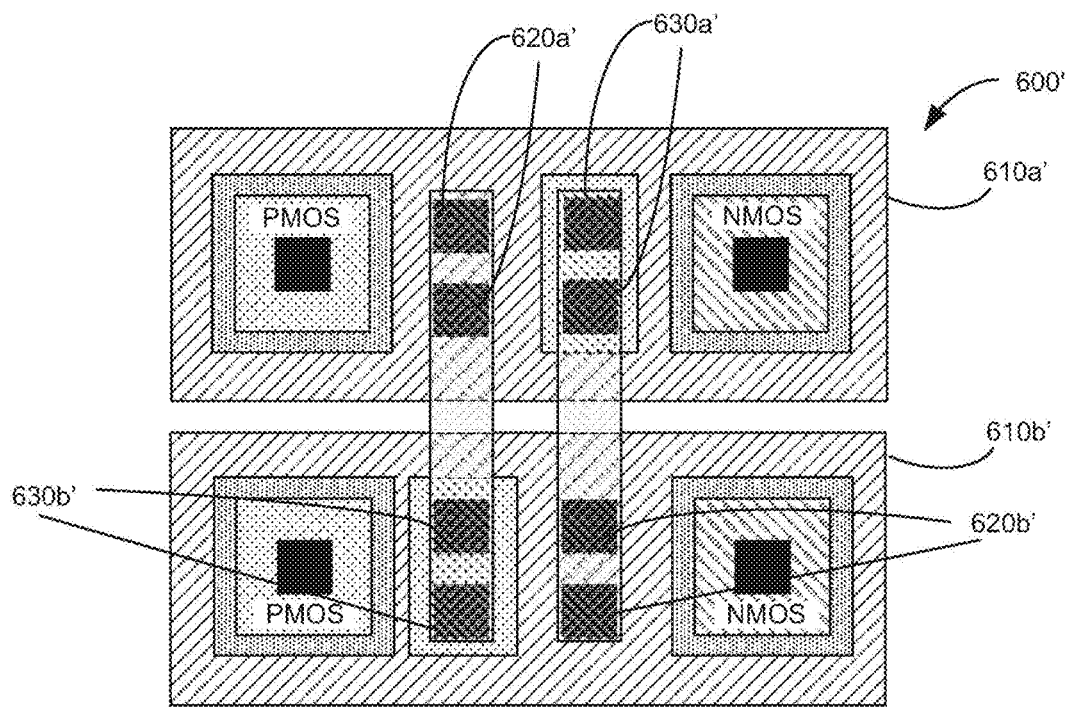

FIG. 6B illustrates a memory cell 600', e.g., an SRAM cell, having two integrated inverters 610*a'* and 610*b'*. Integrated inverter 610*a'* can be the same as integrated inverter 500 discussed above. Inverter 610*b'* can be similar to inverter 500 except that the orientation of input contact(s) 620*b'* and output contact(s) 630*b'* are reversed in comparison to the input contact(s) 620*a'* and output contact(s) 630*a'* of integrated inverter 610*a'*. By reversing the input and output contacts, one of the integrated inverters does not have to be rotated 180 degrees (as in the case of FIG. 6A) for the input contact(s) 620*a'* and 620*b'* to line up (e.g., linearly align) with the opposing output contact(s) 630*b'* and 630*a'*, respectively, for easy strapping. In the memory cell 600', the PMOS transistors are aligned (e.g., linearly aligned) between the two inverters and the NMOS transistors are aligned (e.g., linearly aligned) between the two inverters. Accordingly, because like transistors are aligned, fabrication of the memory cells 600' can be less complex and easier than if like transistors are not aligned, while still keeping the advantage of the simplified and less congested routing.

Figure 6C:
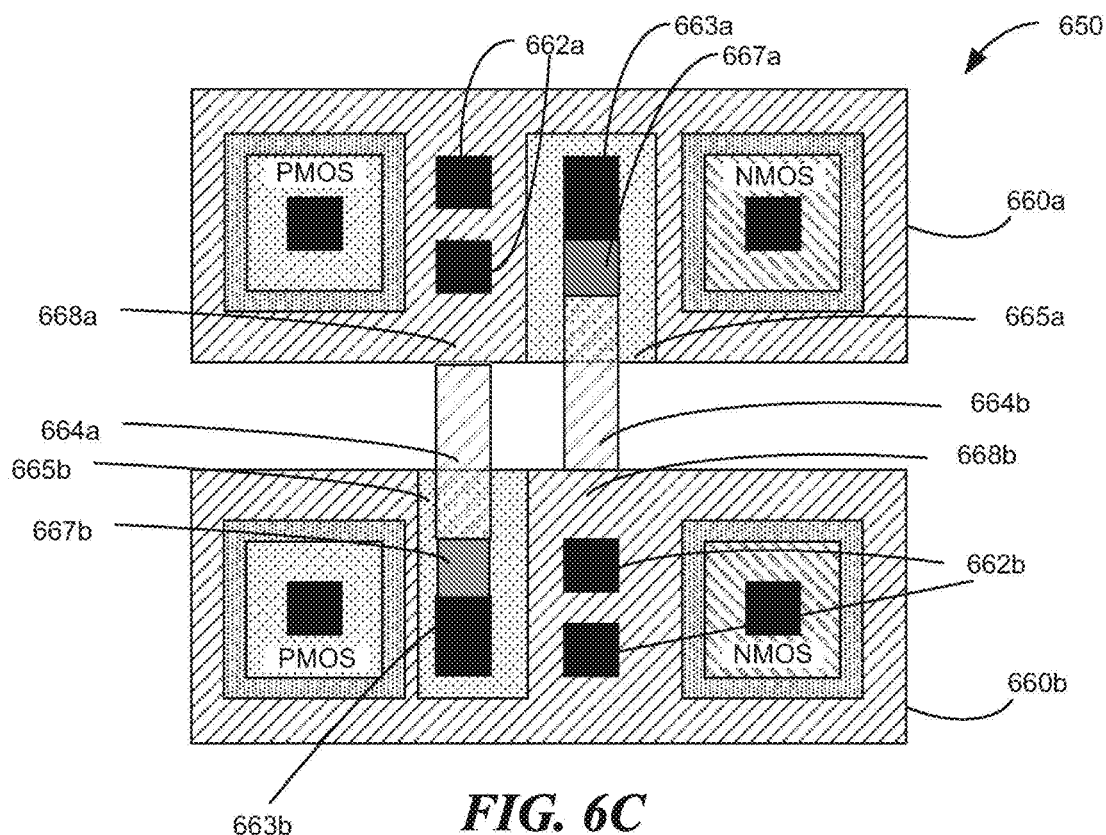
Figure 6D:
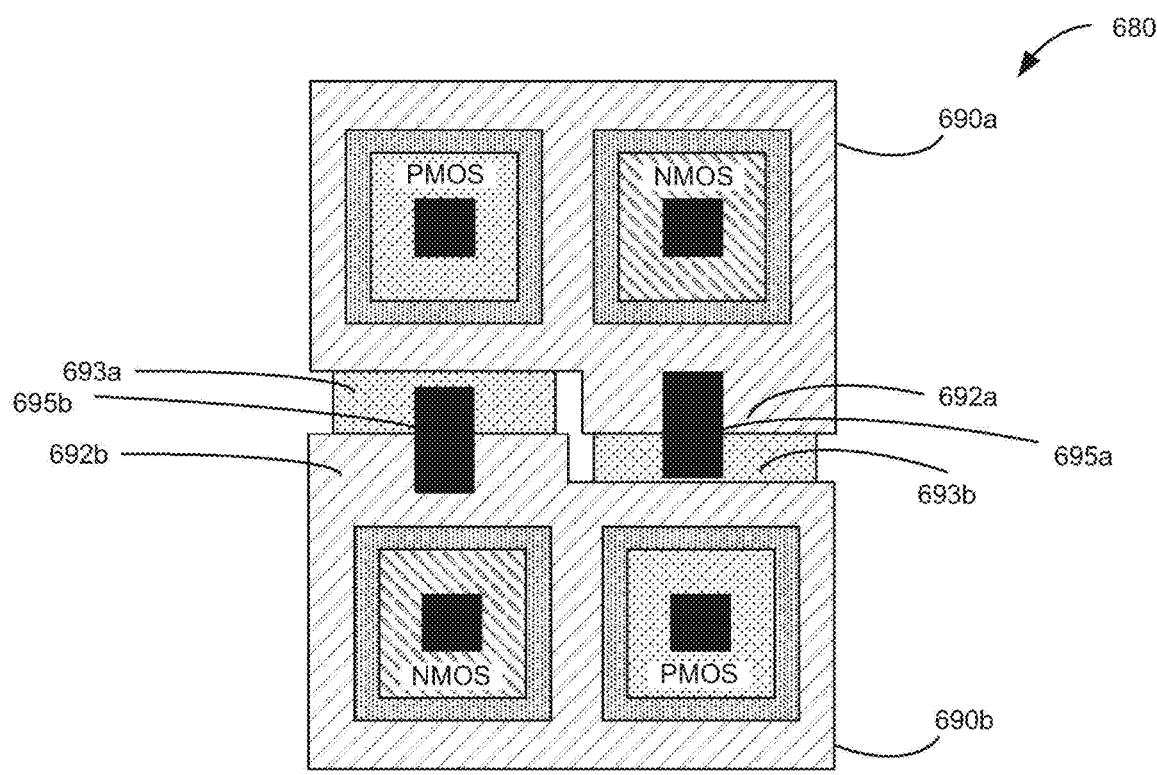

FIGS. 6C and 6D illustrate alternative layout and interconnection arrangements for a memory cell (e.g., an SRAM cell) with integrated inverters. In the embodiment of FIG. 6C, the memory cell 650 includes integrated inverters 660*a* and 660*b*. Integrated inverter 660*a* can be similar to integrated inverter 500 but the silicon layer 665*a* around the output contact 663*a* extends to an edge of the active area of the integrated inverter 660*a*. Integrated inverter 660*b* can also be the same as integrated inverter 660*a* in some embodiments. However, in the embodiment of FIG. 6C, integrated inverter 660*b* is similar to integrated inverter 500' with respect to the arrangement of the PMOS and NMOS inverters, but in integrated inverter 660*b*, the silicon layer 665*b* around the output contact 663*b* extends to an edge of the active area of the integrated inverter 660*b*. As seen in FIG. 6C, the connections between the integrated inverters can be done using a polysilicon connection rather than a metal connection. For example, a polysilicon connection strip 664*a* can extend from the polysilicon gate layer 668*a* corresponding to input contact(s) 662*a* to the extended silicon layer 665*b* corresponding to output contact 663*b*. Similarly, a polysilicon connection strip 664*b* can extend from the polysilicon gate layer 668*b* corresponding to input contact(s) 662*b* to the extended silicon layer 665*a* corresponding to output contact 663*a*. For example, the polysilicon connection strips 664*a* and 664*b* can be stitched to respective output contacts 663*b* and 663*a*. That is, the polysilicon connection strip is formed onto the respective extended silicon layer and the corresponding output contact (e.g., elongated output contact) is formed so as to overlap a portion of the polysilicon connection strip. For example, overlap portion 667*a* represents the overlap of contact 663*a* onto polysilicon connection strip 664b, and overlap portion 667b represents the overlap of contact 663b onto polysilicon connection strip 664a.

FIG. 6D illustrates an embodiment of a memory cell (e.g., an SRAM cell). The memory cell 680 includes integrated inverters 690a and 690b. The PMOS and NMOS transistors are similar in arrangement to that of integrated inverter 500. However, the input and output for the integrated inverter is formed on a same side of the PMOS and NMOS transistors instead of between the transistors. For example, as seen in FIG. 6D, a polysilicon gate section 692a corresponding to an input contact and a silicon oxide section 693a corresponding to an output contact are formed on a same side of the PMOS and NMOS transistors of the integrated inverter 690a. Similarly, a polysilicon gate section 692b corresponding to an input contact and a silicon oxide section 693b corresponding to an output contact are formed on a same side of the PMOS and NMOS transistors of the integrated inverter 690b. In the embodiment of FIG. 6D, the arrangement of the PMOS and NMOS transistors is the same for both the integrated transistors 690a and 690b thus one of the inverters is rotated 180 degrees. However, in other embodiments, the arrangement of the PMOS and NMOS transistors can be revered in integrated transistor 690b so that the transistors of the same type are linearly aligned similar to the embodiment of FIG. 6B. In some embodiments, the input polysilicon gate sections 692a and 692b can be stitched into the respective output silicon oxide section 693b and 693a using corresponding contact strips 695a and 695b (e.g., an elongated output contact). The contact strips can be, for example, polysilicon, metal, and/or another appropriate material. Although integrated inverters having vertical PMOS and vertical NMOS configurations are shown in FIGS. 6A to 6D, those skilled in the art will recognize that integrated inverter 400 can be similarly arranged to form a compact memory cell. Accordingly, for brevity, discussion of the connections in a planar/vertical memory cell is omitted.

Figure 7A:
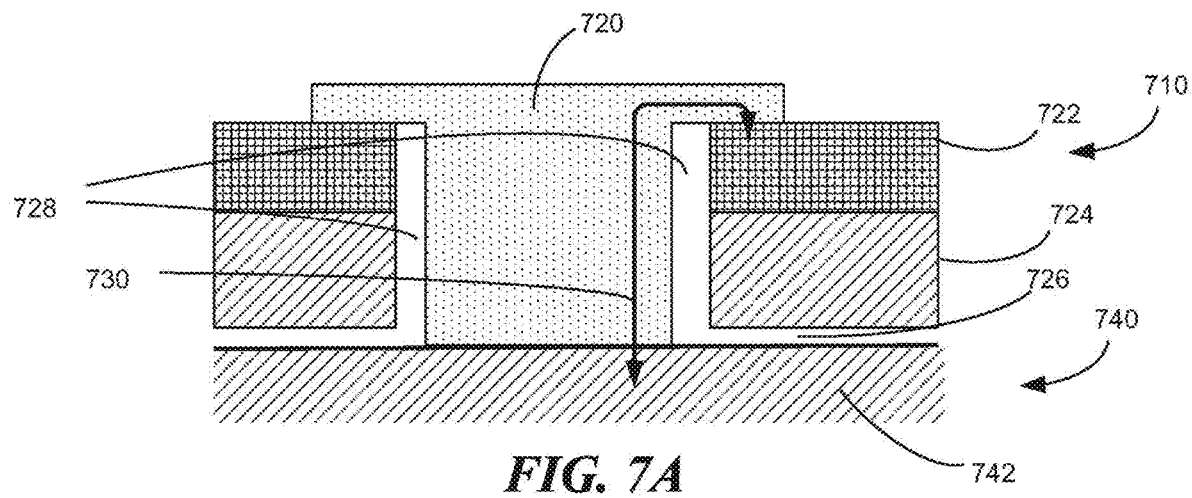
FIGS. 7A and 7B illustrate alternate embodiments for the interconnection of FIG. 6D.
Figure 7B:
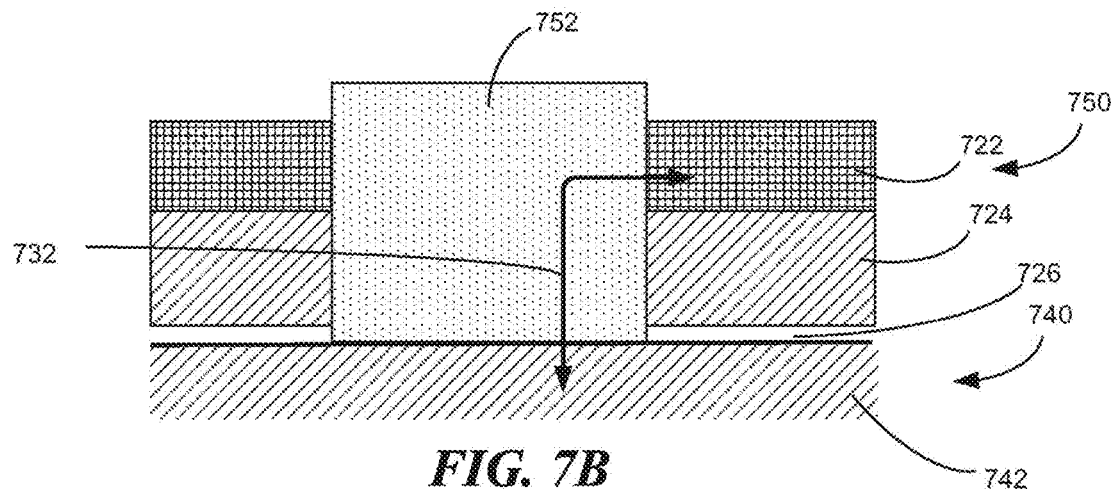

As discussed above with reference to FIG. 6D, the input connection and the output connection can be disposed on a same side of the integrated inverter so that corresponding inverters can be conveniently and compactly connected using, e.g., an elongated contact. However, instead of an elongated contact, in some embodiments, a modified pillar channel can be used to directly connect the input polysilicon gate layer of one of the integrated inverters to the output silicon layer of the other integrated inverter. For example, FIGS. 7A and 7B illustrate two embodiments of a pillar channel contact that can be used in place of an elongated contact configuration of FIG. 6D. In the embodiment of FIG. 7A, the input pillar connection of an integrated inverter 710 is deposited over an output silicon layer 742 of another integrated inverter 740. To form the pillar channel connection 720, an opening in the protective mask for forming the pillar channel 720 is larger than the diameter of the pillar channel 720 so that, when the polysilicon for the pillar channel 720 is deposited, the channel polysilicon overlaps a WSix layer 722 and/or a polysilicon layer 724 that corresponds to the input connection. In some embodiments, only one of the WSix layer 722 or the polysilicon layer 724 may be formed on top of a silicon oxide layer 726. Once the pillar channel 720 is formed, an electrical connection with current path 730 is formed between the input WSix/polysilicon layer 722/724 of the inverter 710 to the output silicon 742 of the inverter 740. In the embodiment of FIG. 7A, a layer of sidewall silicon oxide 728 is formed such that the current path 730 is the full length of the pillar channel 720. In the embodiment of FIG. 8B, a pillar channel 752 of an integrated inverter 750 is formed without a sidewall silicon oxide so that the input WSix/polysilicon layer 722/724 of the inverter 750 comes into direct electrical contact with the polysilicon of the pillar channel 752 and a shorter current path 732 is formed between inverter 750 and the output silicon 742 of the inverter 740. In some embodiments, the diameters of the pillar channel 720 and/or 752 are made as small as possible to keep the capacitance as small as possible while maintain a reliable electrical connection.

Figure 8A:
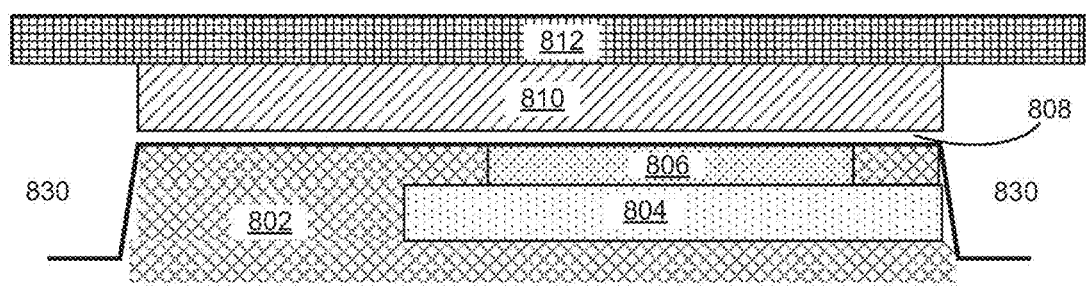
FIGS. 8A to 8C illustrate intermediate components formed in an exemplary fabrication process for an integrated inverter in accordance with the present disclosure.
Figure 8B:
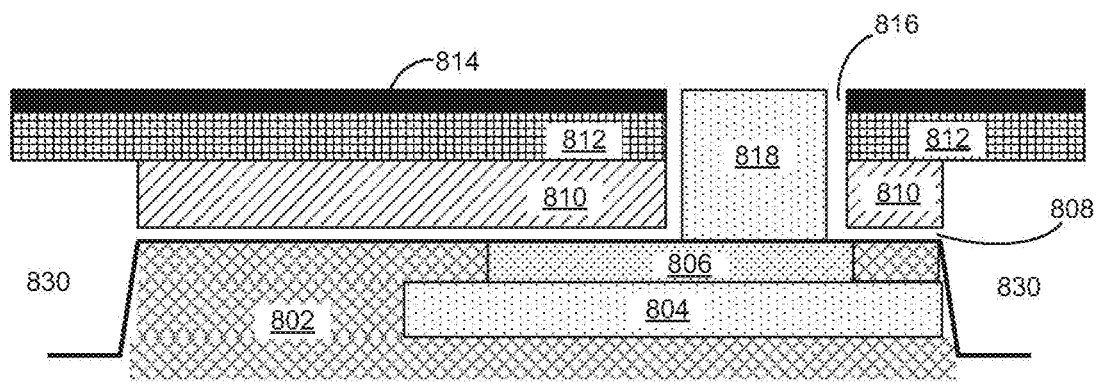
Figure 8C:
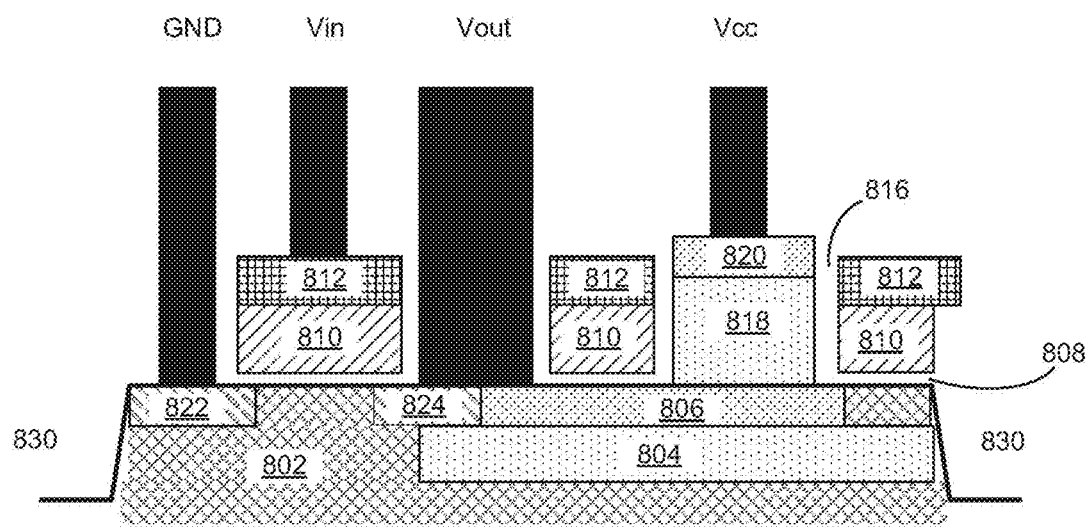

FIGS. 8A-8C illustrate a simplified high-level fabrication process for an integrated inverter having a planar NMOS and a vertical PMOS. Those skilled in that understand the details of a fabrication process for a CMOS inverter and thus, for brevity, details related to photoresist layers, masks, chemical and/or plasma etching, and other known details are omitted. Prior to the deposition of the silicon oxide layer 808, a shallow n-type implant layer 804 is deposited onto a p-type substrate 802. The n-type implant layer 804 deposition provides for isolation of the vertical PMOS transistor. A p+ implant layer 806 can then be added on top of the n-type implant layer 804 to act as the drain for the vertical PMOS transistor. The arrangement of the n-type implant layer 804 and the p+ implant layer 806 is such that the n-type implant layer area is larger and extends out beyond the area of the p+ implant layer 806. For example, in some embodiments, the n-type implant layer 804 is angled and/or a resist trim etch is performed after p+ implant layer 806 such that the n-type implant area extends out farther than the p+ implant layer area. In the case of a vertical NMOS transistor, only an n+ implant layer, which acts as a drain, may be deposited on the p-type substrate. For a vertical CMOS inverter, the steps for the vertical PMOS transistor and the vertical NMOS transistor discussed above can be performed. After the p+ implant layer 806 is deposited, one or more silicon oxide layers 808, one or more polysilicon gate layers 810, and/or one or more WSix (e.g., tungsten silicide) gate layers 812 can be deposited. The layers are added in the appropriate sequence and with an etching of at least the gate layers 810/812 to produce an intermediate component in which the silicon oxide layer 808 deposited over the active area is covered by the polysilicon gate layer 810 and the WSix gate layer 812 and the silicon oxide layer 808 in the STI areas 830 are covered by the WSix gate layer 812.

As seen in FIG. 8B, a protective layer 814 with an opening for the channel 818 for the vertical PMOS transistor is deposited over the WSix gate layer 814. The thickness of the protective layer 814 can be based on a desired amount that the polysilicon of the vertical channel should extend above the WSix gate layer 812. After deposition of the protective layer 814, an etch is performed on the Wsix and polysilicon gate layers 812/814 to create the hole for the channel 818 of the vertical PMOS transistor. One or more layers of silicon oxide are deposited, and a gate sidewall etch is performed to create a hole and expose the bottom to the p+ implant layer 806. With the creation of the lateral gate 816, one or more layers of polysilicon is deposited to create the channel 818. The intermediate component is then subject to chemical mechanical polishing (CMP) the top of protective layer 814. The protective layer 814 is then etched away (not shown in FIG. 8B).

After the protective layer 814 is etched away, as seen in FIG. 8C, a gate etch is performed to define the common gate configuration which includes an opening for the output contact area (Vout). The n+ implant layers 822 and 824 corresponding to the source and drain, respectively, can be deposited after the gate etching process. In addition, a p+ implant layer 820, corresponding to the source of vertical PMOS transistor, can be deposited on the channel 818. After silicon oxide build up and subsequent etching of the openings for the ground GND and Vout contacts, one or more layers of metal (e.g., tungsten) can be deposited to form the source Vcc, ground GND, Vin and Vout contacts.

Figure 9A:
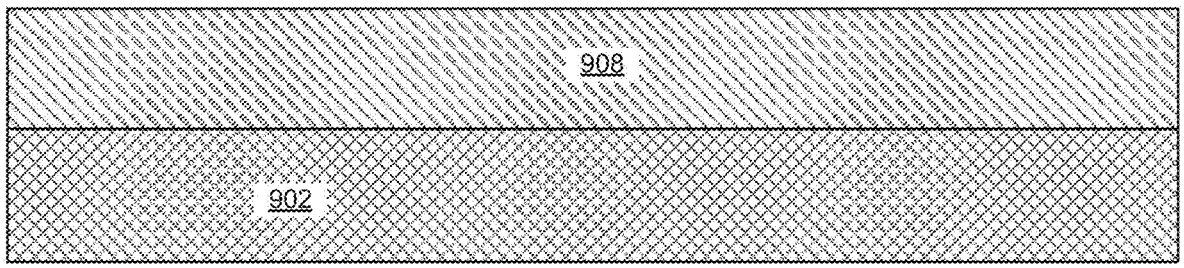
FIGS. 9A to 9G illustrate intermediate components formed in an exemplary fabrication process for an integrated inverter in accordance with the present disclosure.
Figure 9B:
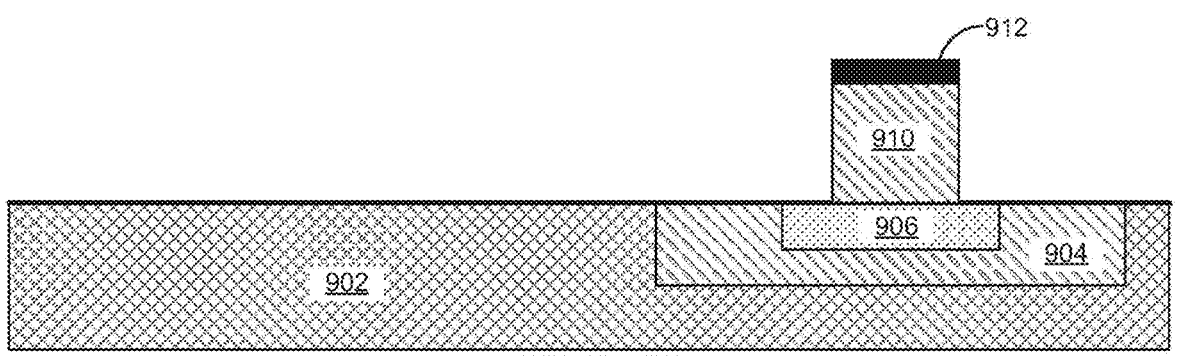

In some embodiments where the integrated CMOS inverter includes a planar NMOS and a vertical PMOS, the fabrication of the vertical PMOS can be accomplished by recess etching the silicon substrate to create the PMOS channel (e.g., a silicon mesa) rather than forming the channel by silicon deposition as discussed above. As seen in FIG. 9A, an n-type silicon layer 908 is formed over a p-type silicon substrate 902. As seen in FIG. 9B, a hard mask 912 is deposited over an area that corresponds to the n-type channel for the PMOS transistor, and the n-type silicon layer 908 is then etched until the p-type substrate 902 is reached. Due to the hard mask 912, a mesa 910 that corresponds to a n-type channel for a PMOS transistor is formed. After the etching process, an n-type tub is formed under a p-type implant layer. That is, one or more n-type dopant layers are deposited into the p-type substrate under the mesa 910 to create an n-type implant 904. The n-type dopant layers of the n-type implant 904 can be angled such that the n-type implant 904 encases a p-type implant 906 that has been deposited under the mesa 910.

Figure 9C:
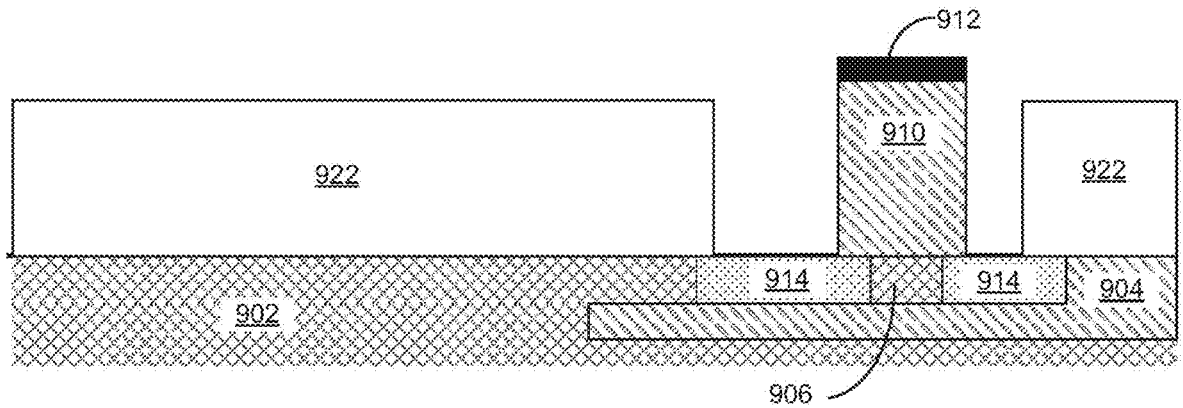
Figure 9D:
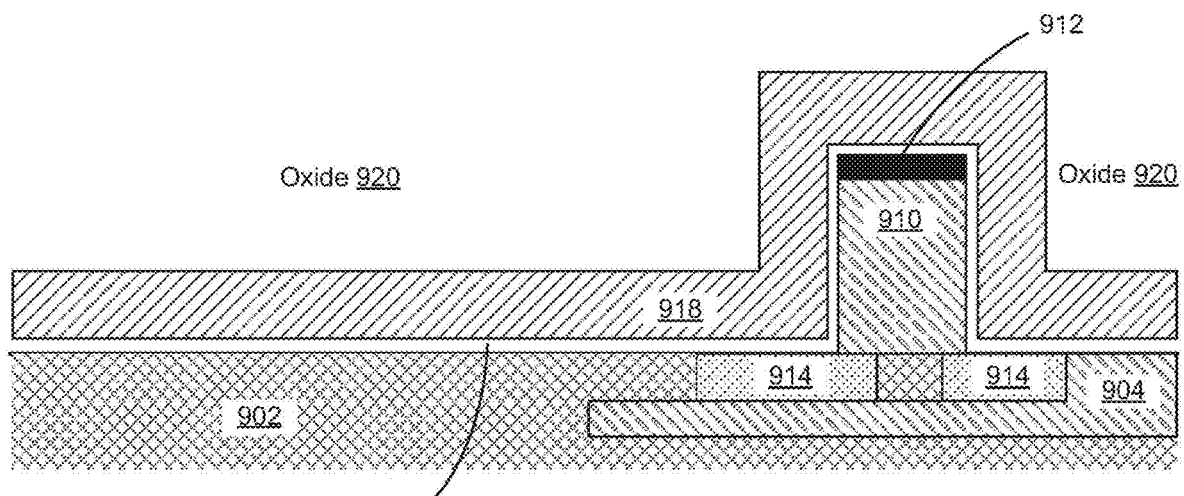
Figure 9E:
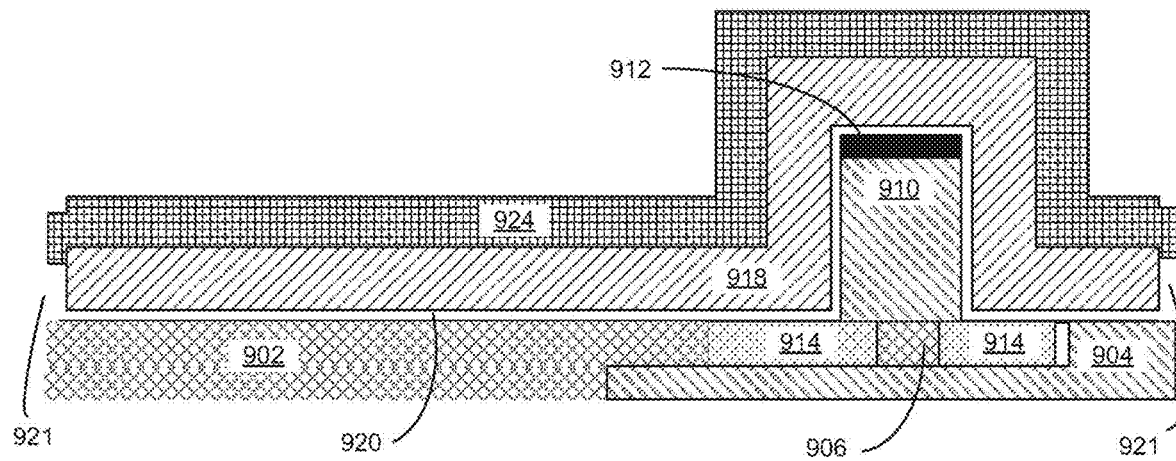

As seen in FIG. 9C, after the etching process, a photoresist layer 922 is added with openings in the photoresist layer 922 that correspond to the drain of the PMOS transistor. The fabrication process then includes adding a p+ implant layer 914 into the p-type implant 906 (see FIG. 9B). As seen in FIG. 9D, the formation process includes depositing one or more silicon oxide layers 916 followed by one or more polysilicon layers 918 and one or more additional silicon oxide layers 920. In addition, each STI is masked and etched. The silicon oxide layers 920 can include sacrificial oxide with stripe to fix any etch-induced damage. As seen in FIG. 9E, the silicon oxide 921 at the STI is recessed below the top of the polysilicon layer 918. One or more WSix layers 924 can be deposited on top of the polysilicon layer 918. In some embodiments, additional thin layer(s) of polysilicon can be deposited prior to the WSix layer 924 based on the topology of the active area-STI interface.

Figure 9F:
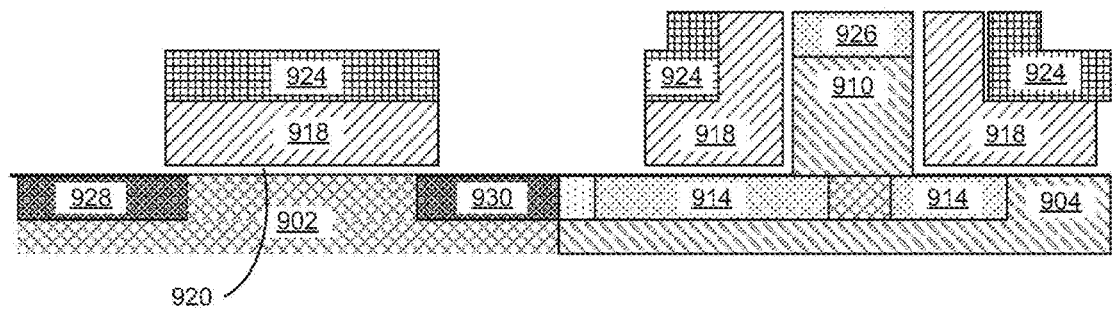
Figure 9G:
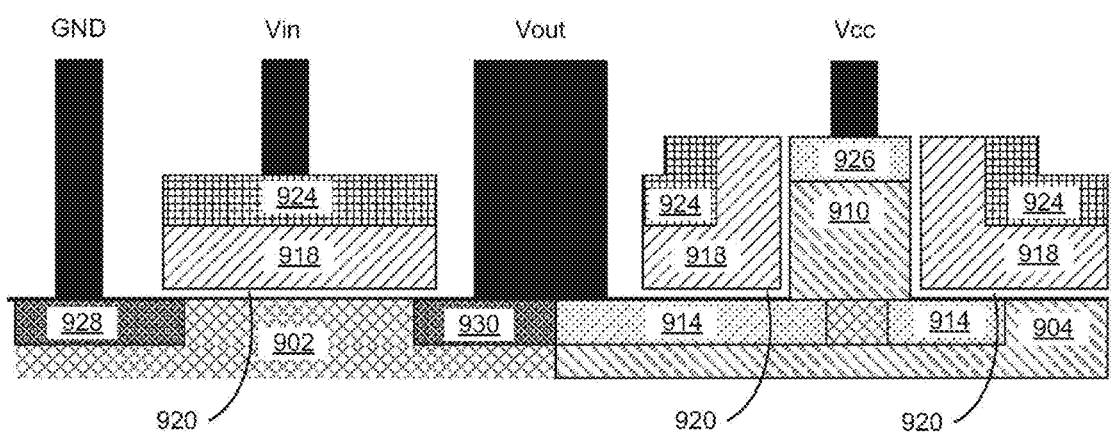

After depositing the WSix layer 924, as seen in FIG. 9F, an etch is performed to expose the hard mask 912 on the mesa 910, and to expose the drain 930 and source 928 areas of an NMOS transistor on top of the silicon substrate 902. A further wet etch can be performed to remove the hard mask 912 from the top of the mesa 910. In addition, using appropriate masking, a p+ implant deposition can be performed to create the source 926 of the PMOS transistor, and an n+ implant deposition can be performed to create the source 928 and the drain 930 of the NMOS transistor. After the backend oxide fill and a CMP, as seen in FIG. 9G, the source contact (e.g., ground GND) for the NMOS source 928, the input contact (e.g., Vin) for common gate 924, the output contact (e.g., Vout) bridging the n+/p+ interface between NMOS drain 930 and PMOS drain 914, and the source contact (e.g., Vcc) for the PMOS source 926 can be deposited.

Although specific embodiments have been illustrated and described herein, it will be appreciated by those of ordinary skill in the art that any arrangement that is calculated to achieve a similar (e.g., the same) purpose may be substituted for the specific embodiments shown. For example, for other embodiments, enhancement-mode-field-effect transistors may be substituted for the depletion-mode-field-effect transistors described above. For example, metal-gate-enhancement-mode-field-effect transistors may be substituted for the metal-gate-depletion-mode-field-effect transistors, and lateral-gate-enhancement-mode-field-effect transistors may be substituted for the lateral-gate-depletion-mode-field-effect transistors. Accordingly, this application is intended to cover any adaptations or variations of the embodiments.

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those of ordinary skill in the relevant art will recognize. For example, although steps are presented in a given order, alternative embodiments may perform steps in a different order. The various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms may also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. For example, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on." Additionally, the terms "comprising," "including," "having," and "with" are used throughout to mean including at least the recited feature(s) such that any greater number of the same feature and/or additional types of other features are not precluded.

The processing device (e.g., processor 130 and/or another controller) represents one or more general-purpose processing devices such as a microprocessor, a central processing circuit, or the like. More particularly, the processing device can be complex instruction set computing (CISC) microprocessor, reduced instruction set computing (RISC) microprocessor, very long instruction word (VLIW) microprocessor, or processor implementing other instruction sets, or processors implementing a combination of instruction sets. Processing device (e.g., processor 130 and/or another controller) can also be one or more special-purpose processing devices such as an application specific integrated circuit (ASIC), a field programmable gate array (FPGA), a digital signal processor (DSP), network processor, or the like.

The machine-readable storage medium (also known as a computer-readable medium) on which is stored one or more sets of instructions or software embodying any one or more of the methodologies or functions described herein. The machine-readable storage medium can be, for example, memory system 100 or another memory device. The term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media and magnetic media.

It will also be appreciated that various modifications may be made without deviating from the disclosure. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

We claim:

1. An apparatus, comprising:
   an array of memory cells;
   a set of first memory circuits, each first memory circuit including a first bit-line connection; and
   a set of second memory circuits, each second memory circuit including a second bit-line connection, the first and second bit-line connections adapted to connect to memory cells in the array of memory cells,
   wherein one or more first memory circuits of the set of first memory circuits are disposed between consecutive second memory circuits of the set of second memory circuits in a width direction,
   wherein the first bit-line connections are disposed in-line to each other in the width direction and the second bit-line connections are disposed in-line to each other in the width direction, and
   wherein the second bit-line connections are offset from the first bit-line connections in a length direction perpendicular to the width direction by a predetermined distance that is greater than zero.

2. The apparatus of claim 1, wherein each first memory circuit of the set of first memory circuits is disposed adjacent to a second memory circuit of the set of second memory circuits to form an alternating pattern.

3. The apparatus of claim 1, wherein two or more of the first memory circuits are disposed between the consecutive second memory circuits in the width direction.

4. The apparatus of claim 1, further comprising:
   a set of third memory circuits, each third memory circuit including a third bit-line connection, the third bit-line connection adapted to connect to memory cells in the array of memory cells,
   wherein the third bit-line connections are offset from the first bit-line connections in a length direction perpendicular to the width direction by a second predetermined distance that is greater than zero and different from the predetermined distance.

5. The apparatus of claim 1, wherein a pitch distance between a first memory circuit and a second memory circuit in a width direction is less than 37 nm.

6. The apparatus of claim 1, wherein a pitch distance between a first memory circuit and a second memory circuit in a width direction is less than 36 nm.

7. The apparatus of claim 1, wherein a pitch distance between a first memory circuit and a second memory circuit in a width direction is between 35 nm to 37 nm.

8. The apparatus of claim 1, wherein the predetermined distance is such that an effective distance between a first bit-line connection of a first memory circuit and a second bit-line connection of an adjacent second memory circuit is between 5 nm to 7 nm.

9. The apparatus of claim 1, wherein the first and second memory circuits are configured to isolate low voltage circuits connected to the respective first and second memory circuits from harmful voltage on the first and second bit-line connections.

10. The apparatus of claim 1, wherein the first and second memory circuits are disposed so as to form opposing pairs of first memory circuits across a centerline and opposing pairs of second memory circuits across the centerline in a mirrored arrangement.

11. The apparatus of claim 10, further comprising:
    a common gate disposed along the centerline to connect the first and second bit-line connections,
    wherein the common gate includes at least one opening for a source connection, and
    wherein the at least one opening for a source connection is disposed between the opposing pairs of first memory circuits.

12. The apparatus of claim 11, wherein the common gate includes well implant layers that are disposed perpendicular to at least one of a line corresponding to an effective distance between adjacent first and second bit-line connections or a line corresponding to a second effective distance between the source connection and the corresponding second bit-line connection.

13. The apparatus of claim 12, wherein the at least one of the source connections and an adjacent opening for the second bit-line connection includes facets along the line corresponding to the second effective distance.

14. The apparatus of claim 1, wherein the first and second memory circuits are disposed so as to form opposing arrangements of first and second memory circuits across a centerline, and
    further comprising: at least two shared gates disposed along the centerline, the at least two gates separated by a continuous source implant area, each shared gate configured to connect respective first and second bit-line connections,
    wherein the continuous source implant area includes at least one source connection.

15. The apparatus of claim 14, wherein the at least two gates include a first gate and a second gate, and
    wherein the arrangement of first and second memory circuits on a side of the first gate are offset with the arrangement of first and second memory circuits on a side of the second gate, and
    wherein the circuit offset is such that the first memory circuits on the first gate side align with the second memory circuits on the second gate side and the second memory circuits on the first gate side align with the first memory circuits on the second gate side, and wherein a source connection of the at least one source connection is disposed in the continuous source implant area between each pair of opposing first and second memory circuits.

16. An apparatus, comprising:
a set of first protection circuits that isolate corresponding first logic circuits from harmful voltage, each first protection circuit having a first connection; and
a set of second protection circuits that isolate corresponding second logic circuits from harmful voltage, each second protection circuit having a second connection,
wherein one or more first protection circuits of the set of first protection circuits are disposed between consecutive second memory circuits of the set of second protection circuits in a first direction,
wherein the first and second protection circuits are arranged such that each second connection is offset from each first connection in a second direction that is perpendicular to the first direction, the offset being a predetermined distance that is greater than zero.

17. The apparatus of claim 16, wherein a pitch distance between a first protection circuit and a second memory circuit in the first direction is less than 37 nm.

18. The apparatus of claim 16, wherein a pitch distance between a first memory circuit and a second memory circuit in the first direction is less than 36 nm.

19. The apparatus of claim 16, wherein a pitch distance between a first memory circuit and a second memory circuit in the first direction is between 35 nm to 37 nm.

20. The apparatus of claim 16, wherein the predetermined distance is such that an effective distance between a first connection on a first protection circuit and a second connection on a second protection circuit is between 5 nm to 7 nm.

* * * * *